(12) United States Patent
Mikami et al.

(10) Patent No.: US 7,973,875 B2
(45) Date of Patent: Jul. 5, 2011

(54) FLAT-PANEL DISPLAY MEMBER AND ITS MANUFACTURING METHOD AND FLAT-PANEL DISPLAY AND ITS MANUFACTURING METHOD

(75) Inventors: Yuko Mikami, Kobe (JP); Takayoshi Kirimoto, Otsu (JP); Keiji Iwanaga, Otsu (JP); Toru Matsumoto, Otsu (JP); Junichi Suga, Otsu (JP)

(73) Assignee: Toray Advanced Film Co., Ltd, Tokyo (JP)

( * ) Notice: Subject to any disclaimer, the term of this patent is extended or adjusted under 35 U.S.C. 154(b) by 679 days.

(21) Appl. No.: 12/064,542

(22) PCT Filed: Aug. 23, 2006

(86) PCT No.: PCT/JP2006/316446
§ 371 (c)(1),
(2), (4) Date: Mar. 24, 2008

(87) PCT Pub. No.: WO2007/023828
PCT Pub. Date: Mar. 1, 2007

(65) Prior Publication Data
US 2009/0190078 A1    Jul. 30, 2009

(30) Foreign Application Priority Data

Aug. 24, 2005 (JP) ................. 2005-242310
Sep. 29, 2005 (JP) ................. 2005-283733

(51) Int. Cl.
*G02F 1/1333* (2006.01)

(52) U.S. Cl. ........... 349/59; 349/187; 349/137; 349/138

(58) Field of Classification Search .................. 349/137, 349/138, 158, 187, 122, 40, 59; 445/58; 428/411.1
See application file for complete search history.

(56) References Cited

U.S. PATENT DOCUMENTS 6,686,031 B2 *  2/2004  Matsufuji et al. ............. 428/212

FOREIGN PATENT DOCUMENTS

| EP | 1267318 A1 | 12/2002 |
|---|---|---|
| EP | 1 283 106 | 2/2003 |
| JP | 60222247 | 11/1985 |
| JP | 62-051140 | 3/1987 |
| JP | 62-215202 | 9/1987 |
| JP | 07 186353 | 7/1997 |
| JP | 9-230797 | 9/1997 |
| JP | 09 230797 | 9/1997 |
| JP | 2000-212779 | 8/2000 |

(Continued)

*Primary Examiner* — Thoi V Duong
(74) *Attorney, Agent, or Firm* — Pillsbury Winthrop Shaw Pittman LLP

(57) ABSTRACT

The present invention relates to a flat-panel display member, including at least an anti-reflection layer, an electrically conductive layer and a transparent resin layer, having the anti-reflection layer disposed on a first face of the electrically conductive layer, and having the transparent resin layer disposed on a second face on the other side of the first face of the electrically conductive layer, wherein a peripheral portion of the above flat-panel display member has an electrode reaching the above electrically conductive layer or the above transparent resin layer from the outermost surface of said first face side. The present invention provides a flat-panel display member capable of being produced with good production efficiency and excellent in electromagnetic wave shielding performance and visibility, and its manufacturing method.

11 Claims, 17 Drawing Sheets

FOREIGN PATENT DOCUMENTS

| | | |
|---|---|---|
| JP | 2001-318613 | 11/2001 |
| JP | 2002043791 | 2/2002 |
| JP | 2002-318544 | 10/2002 |
| JP | 2003-98339 | 4/2003 |
| JP | 2003-150065 | 5/2003 |
| JP | 2004 327720 | 11/2004 |
| JP | 2004327720 | 11/2004 |
| WO | 2005/057606 | 6/2005 |
| WO | 2007/023828 | 3/2007 |

* cited by examiner

FLAT-PANEL DISPLAY MEMBER AND ITS MANUFACTURING METHOD AND FLAT-PANEL DISPLAY AND ITS MANUFACTURING METHOD

CROSS-REFERENCE TO PRIOR APPLICATION

This is a U.S. National Phase Application under 35 U.S.C. §371 of International Patent Application No. PCT/JP2006/316446 filed Aug. 23, 2006, which claims the benefit of Japanese Patent Application Nos. 2005-242310 filed Aug. 24, 2005 and 2005-283733 filed Sep. 29, 2005, both of which are incorporated by reference herein. The International Application was published in Japanese on Mar. 1, 2007 as WO 2007/023828 A1 under PCT Article 21(2).

TECHNICAL FIELD

The present invention relates to a flat-panel display member and its manufacturing method and a flat-panel display using the flat-panel display member and a method of manufacturing a flat-panel display. More specifically, the present invention relates to a flat-panel display member that is disposed on the front face of a flat-panel display, shields electromagnetic waves generated from a flat-panel display screen, and prevents a ghost, and its manufacturing method. In addition, the invention relates to a flat-panel display using the above flat-panel display and a method of manufacturing a flat-panel display having disposed thereon a flat-panel display member.

BACKGROUND ART

Flat-panel displays such as a liquid crystal display (hereinafter, LCD) and plasma display (hereinafter, PDP) are display devices capable of clear full color indication. A flat-panel display usually has a front face filter directing to the prevention of external light reflection, shielding of electromagnetic wave generated from a flat-panel display, flat-panel display protection, and the like disposed on a visible side of the flat-panel display. In particular, a PDP generates strong electromagnetic waves from the viewpoints of its structure and operation principle, and thus gives concerns over influences on human bodies and other machines. Hence, the VCCI (Voluntary Control Council for Interference by Information Technology Equipment) in Japan, FCC (Federal Communications Commission) in the US, and the like stipulate constraint of the electromagnetic waves within criteria. A technology is known that disposes an electrically conductive layer on the front face filter for shielding such electromagnetic waves. When an electrically conductive layer is used, electromagnetic wave shielding performance cannot be maintained unless a ground is establish to remove charges, so the electrically conductive layer needs to be electrically connected to an external electrode. A front face filter is usually formed by laminating an electrically conductive layer as mentioned above and an anti-reflection layer. When an anti-reflection layer is laminated on an electrically conductive layer, a method is normally used in which a portion where the anti-reflection layer is not present is provided so as for the electrically conductive layer to be exposed and in which the exposed portion of the electrically conductive layer is electrically connected to the external electrode. In the case, there is a need to do processing in a sheet form such as frame lamination in which the anti-reflection layer is formed smaller than the electrically conductive layer and laminated to expose the electrically conductive layer in a frame form, or processing in which another member is placed on a portion to be exposed in advance and an anti-reflection layer is laminated thereon and then the other member is detached. However, processing in a sheet form poses the problem of inferior production efficiency. Recently, as the prices of displays go down, decreasing the costs of panels and peripheral members are urgent. For decreasing the cost of a front face filter, a method is proposed that involves laminating a film roll having an anti-reflection layer to a film roll having a wider width than that of the former roll and having an electrically conductive layer by a roll to roll method and then forming electrodes on the two sides on which the electrically conductive layers on both ends in the roll width direction are exposed (see Patent Document 1). However, when portions having exposed electrically conductive layers only on two sides of a front face filter in that manner are disposed and electrodes are formed, the electromagnetic wave shielding performance is inferior as compared with the case where electrodes are formed on all the four sides. Because of this, in the above method, it is proposed that the end faces of the anti-reflection layer of the remaining sides are further enclosed to prevent the leak of electromagnetic wave, thereby improving electromagnetic wave shielding performance. However, due to a decrease in ground efficiency, there is a problem in that electromagnetic wave shielding performance is inferior as compared with the case where electrodes are formed on all the four sides. As described above, a front face filter for a flat-panel display excellent in electromagnetic wave shielding performance and capable of producing it with good production efficiency has never been proposed yet.

On the other hand, a method in which a front face filter is integrated on the display substance of a display panel is proposed (Patent Document 2). Patent Document 2 describes a method of laminating an electromagnetic wave shield material is laminated on a display substrate and the electromagnetic wave shield material is affixed to an optical filter using a transparent sticking material, with a peripheral portion having disposed thereon electrodes of an electromagnetic wave shield material being left. However, for the production of such form, electromagnetic wave shield materials need to be made different in dimension from an optical filter and they need to be affixed to each other; members formed in respective dimensions need to be adjusted so as to be in specific position relations and affixed to each other by a sheet method, whereby the step becomes complex, leading to a factor in cost increase.

Patent Document 1: Japanese Patent Laid-Open No. 2002-318544

Patent Document 2: Japanese Patent Laid-Open No. 2003-150065

DISCLOSURE OF THE INVENTION

Problems to be Solved by the Invention

Now, an object of the present invention is to provide a flat-panel display member capable of being produced with good production efficiency and excellent in electromagnetic wave shielding performance and its manufacturing method. Furthermore, an object of the present invention is to provide a flat-panel display that is improved in electromagnetic wave shielding properties using the above flat-panel display member and a method of manufacturing a flat-panel display excellent in productivity.

Means for Solving the Problems

The present inventors have diligently studied and have found that the above described problems can be solved by the invention below.

(1) A flat-panel display member, including at least an anti-reflection layer, an electrically conductive layer and a transparent resin layer, having the anti-reflection layer disposed on a first face of the electrically conductive layer, and having the transparent resin layer disposed on a second face on the other side of the first face of the electrically conductive layer, wherein a peripheral portion of the above flat-panel display member has an electrode reaching the above electrically conductive layer or the above transparent resin layer from the outermost surface of said first face side.

(2) A flat-panel display having the flat-panel display member of (1) disposed on a visible side of a flat-panel display body.

(3) A method of manufacturing a flat-panel display member having at least an anti-reflection layer, an electrically conductive layer and a transparent resin layer, including a first step of obtaining a laminate having an anti-reflection layer on a first face of an electrically conductive layer and a transparent resin layer on a second face on the other side of the first face, a second step of forming a cavity reaching the above electrically conductive layer or the above transparent resin layer from the outermost surface on said first face side in a periphery of the laminate, and a third step of forming an electrode by filling a conductive material in the cavity.

(4) A method of manufacturing a flat-panel display, including a step of disposing on the visible side of a flat-panel display body a laminate having at least an anti-reflection layer, an electrically conductive layer and a transparent resin layer, having the anti-reflection layer disposed on a first face of the electrically conductive layer, and having the transparent resin layer disposed on a second face on the other side of the first face of the electrically conductive layer, a step of forming a cavity reaching the above electrically conductive layer or the above transparent resin layer from the outermost surface of the first face side of the laminate in the peripheral portion of the above laminate, a step of forming an electrode by filling the cavity with a conductive material, and a step of connecting the electrode to an external electrode.

(5) A method of manufacturing a flat-panel display, including a step of forming a cavity reaching an electrically conductive layer or a transparent resin layer from the outermost surface of a first face side of a laminate in a peripheral portion of the laminate having at least an anti-reflection layer, the above electrically conductive layer and the above transparent resin layer, having the anti-reflection layer disposed on the first face of the electrically conductive layer, and having the transparent resin layer disposed on a second face on the other side of the first face of the electrically conductive layer, a step of disposing the laminate having formed therein the above cavity on the visible side of a flat-panel display body, a step of forming an electrode by filling the cavity with a conductive material, and a step of connecting the electrode to the external electrode.

Effect of the Invention

According to the present invention, a flat-panel display member excellent in productivity can be provided, and further a flat-panel display excellent in electromagnetic wave shielding properties can be provided by disposing the flat-panel display member on the visible side.

DESCRIPTION OF THE REFERENCE NUMERALS

Figure 1:
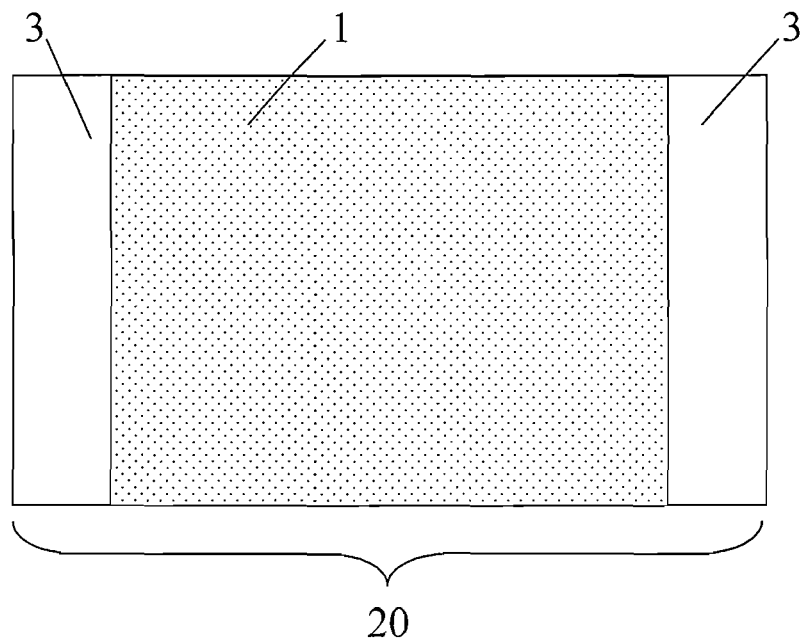
FIG. 1 is a schematic plan view indicating an example of a laminate 1 constituting a flat-panel display member of the present invention.

| | |
|---|---|
| 1 | anti-reflection film |
| 2 | Sticking material |
| 3 | Copper mesh film |
| 4a | Cavity |
| 5 | Copper mesh layer |
| 6 | PET film |
| 7 | Electrode |
| 8 | Glass substrate |
| 9 | Near infrared shielding layer |
| 10 | Color sticking material |
| 11 | Display panel |
| 12 | External electrode |
| 13 | Cover film |
| 20 | Laminate 1 |
| 21 | Laminate 2 |
| 22 | Flat-panel display member |
| 23 | Flat-panel display |
| 31 | Display panel 2 |
| 32 | Display panel 3 |

BEST MODE FOR CARRYING OUT THE INVENTION

A flat-panel display member of the present invention refers to a member that is disposed on the visible side of a flat-panel display to function to shield electromagnetic waves generated from a flat-panel display.

A flat-panel display member of the present invention includes at least an electrically conductive layer, an anti-reflection layer and a transparent resin layer, has the anti-reflection layer disposed on a first face of the electrically conductive layer, and has an electrode disposed in a laminate having the transparent resin layer disposed on a second face.

(Electrically Conductive Layer)

An electrically conductive layer used in a flat-panel display member of the present invention preferably has an area resistance in the range of from 0.01 to 10Ω/□. As the area resistance of an electrically conductive layer is low, electromagnetic waves generated from a flat-panel display can be efficiently shielded. However, decreasing the resistance of an electrically conductive layer normally increases costs from the viewpoints of a material and process. In addition, because electromagnetic waves themselves generated from a flat-panel display have the differences between the kinds and solids of flat-panel displays, it is important to set an appropriate area resistance range corresponding thereto. Use of an electrically conductive layer having the above range of area resistance makes it possible to efficiently shield electromagnetic waves generated from almost all the flat-panel displays, thereby restraining the electromagnetic waves within the range of disturbance field strengths stipulated by the VCCI, FCC and the like.

A flat-panel display member of the present invention needs transparency due to disposing on the visible side of the flat-panel display. The electrically conductive layers having transparency that can be used include conductive meshes, conductive thin films, and the like. The conductive meshes that can be used include, for example, fiber meshes produced by coating a synthetic fiber or metal fiber with metal, metal meshes produced by patterning metal in a lattice form or random mesh form, and the like. The metal meshes include, for example, metal etching films produced by forming a metal film and then pattern etching processing it, materials produced by pattern printing conductive paste, materials produced by pattern printing semiconductor paste and then subjecting it to conductive processing, materials produced by photo-patterning conductive paste, materials produced by photo-patterning semiconductor paste and then subjecting it to conductive processing, and the like. The conductive thin films that can be used include metal thin films, oxide semiconductor films, laminates thereof, and the like. The materials of metal thin films that are used include metals selected from silver, gold, palladium, copper, indium and tin, alloys of silver and other metals, and the like. The methods of forming a metal thin film that can be used include well-known methods such as sputtering, ion plating, vacuum depositing, plating, and the like. The materials of oxide semiconductor films that are used include oxides or sulfides of zinc, titanium, indium, tin, zirconium, bismuth, antimony, tantalum, cerium, neodymium, lanthanum, thorium, magnesium, gallium, and the like, or mixtures of the oxides thereof, and the like. The methods of forming oxide semiconductors that can be used include well-known methods such as sputtering, ion plating, ion beam assisting, vacuum depositing, wet coating, and the like.

A conductive mesh is high in conductivity and a conductive thin film is excellent in transparency. A flat-panel display that needs high electromagnetic wave shielding performance like PDP is excellent in conductivity, and thus preferably makes use of conductive meshes. Furthermore, conductive meshes have high general purposes and are applicable to a variety of patterns, so metal meshes are preferably used. A metal mesh is generally produced by laminating a copper foil on a supporter such as a plastic film and then patterning it in a mesh form, but the present invention is not limited thereto. The metal mesh uses a regular repeating pattern like a lattice pattern and a random pattern is also preferably used in terms of moiré prevention. The random patterns include materials randomizing line widths and pitches, and the like based on random numbers, materials like branched leaves, sea-island structures by repelling, and the like. Preferably, the line width of metal meshes is in the range of from 5 to 40 μm, the line interval (pitch) is in the range of from 100 to 400 μm, and the thickness of metal meshes is in the range of from 3 to 20 μm.

Additionally, the use of a roll-shaped metal mesh film having a metal mesh formed on a plastic film enables the production of a continuous laminate of an optical functional layer such as a transparent electrically conductive layer, transparent substrate and anti-reflection layer preferably used in the present invention. Moreover, the mesh pattern is usually repeatedly formed in a leaf form matched to a kind; however, the use of a continuous mesh roll having continuously formed thereon a mesh pattern enables processing in an arbitrary size after lamination, so the reduction of the number of kinds becomes possible. Additionally, the detachment of a defect portion only in the case where a defect such as a foreign matter is generated increases the yield of a step.

When a conductive mesh is used as an electrically conductive layer, the entire face of the electrically conductive layer may be processed in a mesh pattern, only a portion corresponding to the image display region of a flat-panel display of an electrically conductive layer may be processed in a mesh pattern and a portion corresponding to the outside of the image display region may be a continuous metal film layer (also called a solid metal film). The outside of the image display region does not affect the indication of a display, and thus needs no transparency.

(Anti-Reflection Layer)

A flat-panel display member of the present invention has an anti-reflection layer on a first face of an electrically conductive layer. An anti-reflection layer, when installed on the visible side of a flat-panel display, prevents deterioration of image indication of a flat-panel display by anti-reflection of external light and ghost prevention. The anti-reflection layers that can be used include anti-reflection films (AR films), anti-glare films (AG films), anti-glare anti-reflection films (AGAR films), or the like.

The AR film normally uses a film produced by laminating two or more layers of high and low refraction index layers on a supporter comprising a plastic film such as a polyethylene terephthalate film (PET), triacetylcellulose film (TAC), laminating in order listed above. Layer constitution and the film thickness of each layer can be determined by optical designing, taking into account the optical properties of a supporter. With anti-reflection properties of an AR film, the luminous reflectance of a surface is preferably 3% or less.

An AG film usually refers to a film having fine lips and dips on it surface, and makes use of a film produced by dispersing particles into a thermosetting resin or photo-setting resin and then applying it onto a supporter and curing, or a film produced by applying thermosetting resin or photo-setting resin on a surface and pushing a mold having a desired surface state thereonto to form lips and dips and then curing it, or the like. With the anti-glare property of an AG film, the haze value (JIS K 7136; 2000) is preferably from 0.5 to 20%.

An AGAR film is obtained by forming an anti-reflection film on a film having an anti-glare property or on a supporter. The luminous reflectance of the surface of an AGAR film is preferably 3% or less. Possession of such optically functional layer can restrain reflection on the surface of a flat-panel display and improve contrast without decreasing the luminance.

In the present invention, an electrically conductive layer may directly make contact with an anti-reflection layer or a plastic film, adhesive layer, sticking material layer or the like may be interposed therebetween.

(Transparent Resin Layer)

A flat-panel display member of the present invention has a transparent resin layer on a second face of the other side of a first face of an electrically conductive layer. In the present invention, a transparent resin layer refers to a transparent resin layer directly made contact with an electrically conductive layer and is disposed, and may also be a single layer or a plurality of layers.

The transparency of a transparent resin layer is preferably 5% or less on the basis of haze values according to JIS K 7136 (2000). The total light transmittance of a transparent resin layer (JIS K 7361; 1997) is preferably 60% or more, more preferably 85% or more.

A transparent resin layer in the present invention serves as a supporter of the electrically conductive layer, an adhesive material or sticking material affixing the electrically conductive layer to the supporter, or an adhesive material or sticking material laminating a flat-panel display member to a flat display, or the like.

As such transparent resin layer, a single material selected from a film, sticking material and adhesive material or a composite layer thereof can be preferably used.

As the films, plastic films such as polyester films, polyacetylcellulose films, polyacryl films, polycarbonate films, epoxy films and polyurethane films that have good transparency and excellent mechanical strength are preferred. The thickness of the film is normally preferably from 0.01 to mm, more preferably from 0.05 to 0.3 mm from the viewpoint of flexibility.

The sticking materials include acryl, silicon, urethane, polyvinyl butyral, ethylene-vinyl acetate, and the like. The thickness of a sticking material is preferably from 0.02 to 1.5 mm.

The adhesive materials include epoxy resins such as bisphenol A epoxy resin, tetrahydroxyphenylmethane epoxy resin, novolac epoxy resin, resorcin epoxy resin and polyolefin epoxy resin, (di)enes such as natural rubber, polyisoprene, poly-1,2-butadiene, polyisobutene, polybutene, poly-2-heptyl-1,3-butadiene and poly-1,3-butadiene, polyethers such as polyoxyethylene, polyoxypropylene, polyvinylethyl ether and polyvinylhexyl ether, polyesters such as polyvinylacetate and polyvinylpropionate, polyurethane, ethylcellulose, polyvinylchloride, polyacrylonitrile, polymethacrylonitrile, polysulfone, phenoxy resin, and the like. The thickness of an adhesive material is preferably from 0.01 to 0.05 mm.

(Shape)

A flat-panel display member of the present invention is placed on the visible side of a flat-panel display body. A flat-panel display body is normally a rectangle, so the shape of a flat-panel display member of the present invention is preferably substantially a rectangle. When a flat-panel display member is disposed on the visible side of a flat-panel display body, the sizes of the long and short sides of the flat-panel display member need to be respectively the same as, or less than, those of the long and short sides of the flat-panel display body, and the area of the flat-panel display member needs to be larger than the display area (image indication area) in the flat-panel display. In particular, where a flat-panel display member is made to closely contact with a flat-panel display body for visibility improvement, when the long and short sides of the flat-panel display member are respectively shorter than the long and short sides of the flat-panel display body, a margin for position deviation is obtained during installment and also the flat-panel display member is made easy to detach when disadvantages such as defect findings by inspection after installment. Although the shapes of the four sides of flat-panel display member can be selected from a right angle, R shape or the like, as appropriate, during the above-mentioned detachment, the fact that at least one side is a right-angle shape is preferred in that the maintenance of the flat-panel display member becomes easy during detachment initiation.

(Electrode)

In the present invention, the electrode reaches an electrically conductive layer or transparent resin layer from the outermost surface of the first face side of a flat-panel display member and functions to implement conduction between the electrically conductive layer and an external electrode. Without installment of such an electrode, conduction between the electrically conductive layer and external electrode becomes insufficient, thereby being incapable of obtaining excellent electromagnetic wave shielding performance.

Herein, the outermost surface of a flat-panel display member refers to the outermost surface of the first face side of a flat-panel display member in a laminate produced by placing at least an anti-reflection layer, electrically conductive layer and transparent resin layer in order listed. A cover film or the like to be eventually detached and removed, is not contained in a laminate. Thus, in a laminate produced by placing a cover film, an anti-reflection layer, an electrically conductive layer and a transparent resin layer in order listed, the outermost surface is the surface of the anti-reflection layer.

The electrode is disposed in a periphery of a flat-panel display member. Herein, the peripheral portion refers to a vicinity of the outer periphery of a flat-panel display member and to a portion corresponding to the outside of the image indication region of a flat-panel display when the flat-panel display member is placed in a flat-panel display body. The position in which an electrode is preferably placed 1 mm or more inside the end of a flat-panel display member and is in the range of 1 mm or more outside a portion corresponding to an image indication region. When a flat-panel display member is disposed on the seeing face of a flat-panel display body, the peripheral portion is outside the image indication region of a flat-panel display and thus does not affect the indication of the display. From the viewpoint of obtaining high ground efficiency, electrodes are preferably disposed on all the four sides facing a flat-panel display member.

Figure 7:
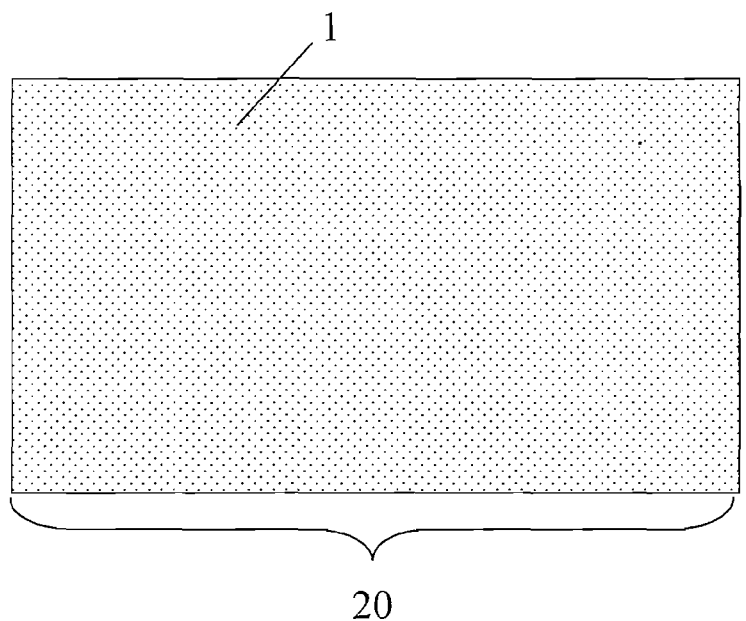
FIG. 7 is a schematic plan view indicating an example of a laminate 1 constituting a flat-panel display member of the present invention.
Figure 33:
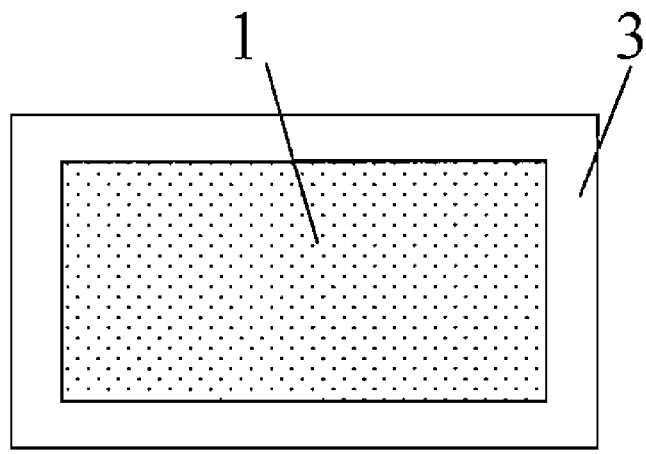
FIG. 33 is a plan view of a conventional flat-panel display member.
Figure 34:
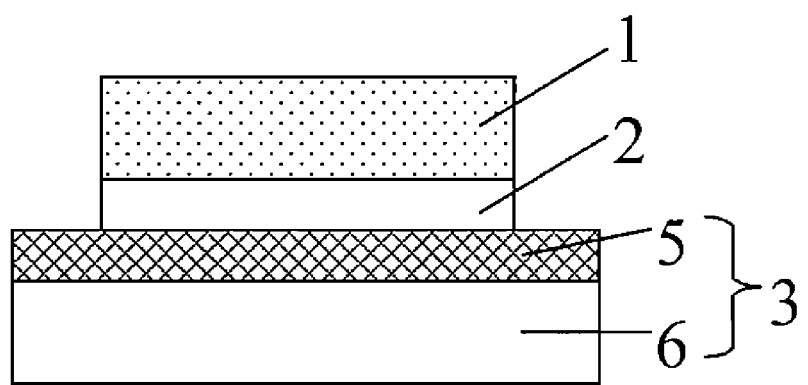
FIG. 34 is schematic sectional view of a conventional flat-panel display member.

One example of conventional flat-panel display members are shown in FIGS. 33 and 34. With the edges of the four sides, an electrically conductive layer 5 is in a state of exposure without the presence of an anti-reflection film 1 and a sticking material 2, and its exposed portion is an electrode. This exposed portion of the electrically conductive layer can be exposed by laminating the anti-reflection film 1 and the sticking material 2 the sizes of which are smaller than the size of the electrically conductive layer 5. Alternatively, as shown in FIG. 7, after the anti-reflection film 1 and the sticking material 2 the sizes of which are the same as the size of the electrically conductive layer 5 are laminated, an exposed portion can be disposed by making a cut in the peripheral portion and then detachment removing only the anti-reflection film 1 and the sticking material 2 in the peripheral portion. However, even in both cases, the cut needs to be made in a leaf form, so production efficiency is low.

Now, the present inventors have studied a method of forming an electrode that has high production efficiency and can obtain excellent electromagnetic wave shielding performance, having led to the present invention.

In other words, it is characterized that a flat-panel display member of the present invention is constituted by a laminate including at least an anti-reflection layer, an electrically conductive layer and a transparent resin layer, wherein the anti-reflection layer is disposed on a first face of the electrically conductive layer, wherein the transparent resin layer is disposed on a second face on the other side of the first face of the electrically conductive layer. It is also characterized that a flat-panel display member of the present invention has an electrode (hereinafter, referred to as an electrode of the present invention) reaching the electrically conductive layer or the transparent resin layer from the outermost surfaces of the first face side in a peripheral portion of the laminate.

Herein, "the electrode reaches the electrically conductive layer" means a state in which an electrode makes contact with an electrically conductive layer, but it does not penetrate the electrically conductive layer or make contact with the transparent resin layer. "The electrode reaches the transparent resin layer" means a state in which the electrode makes contact with the transparent resin layer penetrating through the electrically conductive layer, but does not penetrate the transparent resin layer.

An electrode of the present invention must not penetrate till the outermost surface of the second face side. In other words, an electrode of the present invention is not formed in a shape that penetrates the laminate, so the cavity is also formed so as not to penetrate the laminate.

In the case where an electrode has a shape that penetrates the laminate, the cavity for forming the electrode must penetrate the laminate. In this case, the rigidity of the laminate and thus the flat-panel display member becomes small. In addition, in the present invention, a linear and continuous electrode is preferably disposed, but such an electrode is difficult to form in a shape that penetrates the laminate. Even if it can be formed, the rigidity of the flat-panel display member becomes extremely small. Additionally, in an aspect of implementing the formation of the cavity and the electrode after a laminate of the present invention is installed in a flat-panel display body as described below, when a cavity penetrating the laminate is formed, a disadvantage such as hurting a display panel or the like is suffered in some cases.

Disposing the above mentioned electrode of the present invention in a flat-panel display member can be continuously carried out with a roll shape being kept, so a flat-panel display member of the present invention enables the production at a high efficiency as compared with a conventional flat-panel display member as described above.

Moreover, because an electrode is formed in the direction of the thickness of a flat-panel display member in the present invention, the leakage of electromagnetic waves from end faces of an anti-reflection layer can be prevented as compared with the case where a portion in which an electrically conductive layer is exposed is disposed in a peripheral portion, whereby higher electromagnetic wave shielding performance can be exhibited.

Furthermore, in the present invention, the rigidity of a flat-panel display member becomes high and workability is improved as compared with the case where an electrode is disposed that penetrates from the outermost surface of the first face side of a flat-panel display member to the outermost surface of the second face side, a flat-panel display member can be manufactured at a high efficiency.

In the present invention, when an electrically conductive thin film is used as an electrically conductive layer, the electrode is suitably formed so as to reach the electrically conductive layer (electrically conductive thin layer) from the outermost surface of the first face side. In addition, when a metal foil processing in a mesh pattern only a portion corresponding to an image indication region (a peripheral portion of the image indication region is a continuous metal foil) is used as an electrically conductive layer, the electrode is suitably formed so as to reach the electrically conductive layer (metal foil). When an electrode is formed that is conducted to an electrically conductive thin film or metal foil as described above, from the viewpoints of ground efficiency and easiness of cavity formation, an electrode reaching the electrically conductive layer is more advantageous than an electrode reaching the transparent resin layer.

On the other hand, when an electrically conductive mesh (both the image indication region and its peripheral portion are constituted by the electrically conductive mesh) is employed as an electrically conductive layer, an electrode reaching the transparent resin layer is preferably formed. This enables the area of the connected portion of the electrically conductive layer and electrode to be large and ground efficiency to be improved, thereby exhibiting higher electromagnetic wave shielding performance. In this case, although the cavity penetrates the electrically conductive layer (electrically conductive mesh), the cavity is preferably formed by means that does not cut the electrically conductive mesh. Such means preferably makes use of a laser.

An electrode of the present invention is preferably formed by filling an electrically conductive material into the cavity formed in the laminate. The electrically conductive material used herein includes electrically conductive paste and electrically conductive solids matched to the shape of the cavity. Electrically conductive paste is preferably used in terms of high filling efficiency to the cavity. As electrically conductive paste, metal paste containing a metal selected from silver, gold, palladium, copper, iridium and tin, or an alloy of silver and other metals, or the like is preferred due to obtaining high electrical conductivity.

A planar shape in the outermost surface of an electrode may be any one of circular, polygonal, continuous, discontinuous shapes, and other shapes, and a linear and continuous shape is preferred. An electrode with a linear and continuous shape is disposed, whereby a high ground efficiency can be obtained.

In this case, the width at the height position of the outermost surface of an electrode is preferably 4 mm or less, more preferably 3 mm or less, still more preferably 2 mm or less, and particularly preferably 1 mm or less. The lower limit is preferably 0.3 mm or more. Setting the width at the height position of the outermost surface of an electrode to be ranges as mentioned above enables conduction to an external electrode to be sufficiently secured, is capable of rendering influences to the image indication region to be few, and makes it possible to sufficiently secure the joint strength between the electrically conductive layer and electrode. When the width at the height position of the outermost surface of an electrode exceeds 4 mm and becomes large, the electrode is liable to detach from the laminate. The width at the bottom of an electrode is preferably 0.1 mm or more, more preferably 0.2 mm or more in order to secure a contact area needed for conduction between the electrically conductive layer and electrode. The upper limit is preferably 2 mm or less, more preferably 1 mm or less.

Herein, the width at the height position of the outermost surface of an electrode refers to the width of an electrode at a position of the height of the outermost surface of a flat-panel display member. In addition, the width at the bottom of an electrode refers to the width of the electrode at a position of the depth of 95% of the depth to the deepest portion of the electrode from the outermost surface of the first face side of a flat-panel display member at a portion where the depth of an electrode is largest in the thickness direction of a flat-panel display member.

Additionally, the length of an electrode is preferably 10% or more of the side length of a flat-panel display member having disposed therein the electrode, more preferably 30% or more, particularly preferably 50% or more. The ratio of the length of an electrode to the length of the above mentioned side is preferably large from the viewpoint of obtaining good electromagnetic wave shielding performance. The length of an electrode when the electrode is discontinuous line (broken line) is the length of the total of the broken lines.

Electrodes are preferably disposed on all the four sides of the peripheral portion of a flat-panel display member. In this case, electrodes of the present invention are preferably disposed on at least two sides facing each other of the four sides. On the other two sides, electrodes in which the conventionally electrically conductive layer is exposed may be formed. Additionally, electrodes of the present invention may be disposed on three sides and on the remaining one side may be disposed an electrode in which the electrically conductive layer is exposed. Still moreover, electrodes of the present invention may be disposed on all the four sides. In any aspects, as described below, the member can be produced with good productivity as compared with a conventional flat-panel display member. In addition, an electrode is connected to an external electrode of a flat-panel display to be capable of establish a ground in peripheral portions of all the four sides, whereby a flat-panel display excellent in electromagnetic wave shielding properties can be provided.

Moreover, electrodes of the present invention are disposed on at least two sides facing each other of the four sides, whereby the largest value of the deviations of the end positions of the electrically conductive layer and anti-reflection layer on at least two sides facing each other of a flat-panel display member can be made to be 1 mm or less. This can restrain the step of the flat-panel display member and produce a homogeneous laminate when a flat-panel display member is laminated to a display panel. In a conventional flat-panel display member in which electrodes in which electrically conductive layers are exposed are placed on all the four sides, steps due to the deviations of the end positions of the electrically conductive layer and anti-reflection layer are generated in all the four sides, whereby a uniform laminate is difficult to produce.

In the cross section shape of an electrode of the present invention, the cross-sectional area A at the height position of the outermost surface is preferably larger than the cross-sectional area B of the bottom. When A is equal to, or less than B, in particular when an electrode is formed using an electrically conductive paste having a high viscosity, or the like, the electrically conductive paste hardly reaches the bottom of the cavity, so the attainment of the area of contact of the electrically conductive layer with the electrode is difficult, whereby an electrode with a high ground efficiency is difficult to obtain. On the other hand, when taking into consideration the influence on the image indication region of a flat-panel display, adhesion between the electrode and electrically conductive layer, etc., preferably the cross-sectional area A is not larger than required, so preferably the upper limit of A/B is not equal to 5 or more. Thus, the above cross-sectional area A and the cross-sectional area B preferably satisfy the equation (1) below.

$$1 < A/B < 5 \tag{1}$$

Still more preferably, the A and B meets equation (2) below.

$$1.2 < A/B < 3 \qquad (2)$$

wherein the cross-sectional area B of the bottom of an electrode is, in a portion where the depth of the electrode in the thickness direction of a flat-panel display member is deepest, the cross-sectional area of the electrode in the cross section at a position of the depth of 95% of the depth from the outermost surface of the first face side of the flat-panel display member to the deepest portion of the electrode.

Where the planar shape of an electrode of the present invention is a linear and continuous shape, the cross-sectional areas A and B can be evaluated respectively from the products of the widths at height position of outermost surface and at the bottom, of an electrode, and the length of the electrode. The widths at height position of outermost surface and at the bottom, of an electrode, can be evaluated from the photograph, taken under an electron microscope, of the cross section obtained by cutting the electrode forming portion of a laminate in the thickness direction. When two or more electrodes are present like a discontinuous linear line (broken line), the cross-sectional areas A and B are respectively the total values of all the areas for each electrode.

Figure 31:
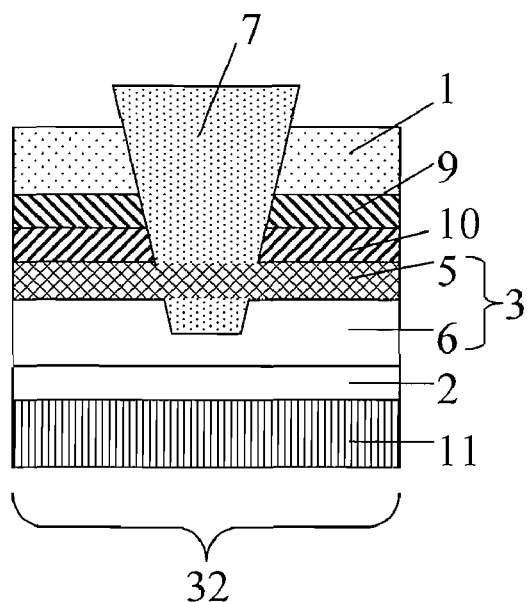
FIG. 31 is a schematic sectional view in a peripheral portion of an example of a display panel 3 constituting a flat-panel display of the present invention.

The electrode is formed so as to be a height at least equivalent to that of the outermost surface of the first face side of a flat-panel display member in order to secure the conduction to the outer electrode. Furthermore, as shown in FIG. 31, an electrode is preferably formed in a shape protruded from the outermost surface of the first face side of a flat-panel display member. Extrusion of an electrode from the outermost surface further improves the ground efficiency. The height of an electrode protruded from the outermost surface is preferably in the range of from 10 to 200 μm, more preferably in the range of from 15 to 150 μm, particularly preferably in the range of from 20 to 100 μm. In this case, the cross-sectional area A of the electrode is the cross-sectional area when the electrode is cut at the height position of the outermost surface of the flat-panel display member.

(Transmittance Control)

Light transmittance control function can be further imparted to a flat-panel display member of the present invention. The light transmittance control functions include a color function of controlling the light transmitted, an infrared shielding function, an orange light shielding function, an ultraviolet shielding function, and the like. The PDP emits near infrared rays and orange light from the viewpoints of its structure and light emission principle. Near infrared rays possibly affect peripheral equipment and bring about malfunctions. Orange light is generated by the light emission of a red light emission fluorescent material and excitation of neon of an encapsulated rare gas and poses the problem of causing a decrease in color purity of red light emission. Hence, when orange light is used particularly for PDPs, near infrared ray shielding function and orange light shielding function are preferably imparted thereto.

With near infrared ray shielding function, the maximum value of light transmittance in the wavelength range of from 800 to 1100 nm is preferably 15% or less. The methods of imparting near infrared ray shielding function to a flat-panel display member include a method of using an electrically conductive thin film as an electrically conductive layer. An electrically conductive thin film reflects near infrared rays by free electrons of a metal. In addition, there is a method that disposes a selected wavelength reflection layer using a refraction index control multi-layer film on the flat-panel display member. Moreover, there is also a method of containing a near infrared ray absorbing pigment in any layer of the flat-panel display member. The near infrared ray absorbing pigments include phthalocyanine compounds, anthraquinone compounds, dithiol compounds, diimonium compounds, and the like.

With orange light shielding function, the smallest value of light transmittance in the wavelength range of from 580 to nm is preferably 30% or less. The methods of imparting orange light shielding color function to a flat-panel display member include a method of disposing a selected wavelength reflection layer using a refraction index control multi-layer on the flat-panel display member. In addition, there is also a method of containing an orange light absorbing pigment in any layer of the flat-panel display member. The orange light absorbing pigments that are used include dyes or pigments having a desired absorption wavelength.

The methods of containing pigments as mentioned above such as near infrared ray absorption and orange light absorption pigments in any layer of the flat-panel display member that are as appropriate selected include a method of using a plastic film prepared by kneading/dispersing or melting a pigment therein, a method of applying a paint prepared by kneading/dispersing or melting a pigment therein onto a supporter, a method of using an sticking material prepared by kneading/dispersing or melting a pigment therein, and other methods. Additionally, combinations of each method may be used.

(Laminate)

A laminate constituting a flat-panel display member of the present invention has at least a transparent resin layer, an electrically conductive layer and an anti-reflection layer in order listed. Some examples of the laminate of the present invention will be indicated in the following.

a) Sticking material layer/plastic film/adhesive material layer/(second face) electrically conductive layer (first face)/sticking material layer/plastic film/anti-reflection layer (in this constitution, the transparent resin layer is a composite of sticking material layer/plastic film/adhesive material layer)

b) Sticking material layer/plastic film/(second face) electrically conductive layer (first face)/sticking material layer/plastic film/anti-reflection layer (in this constitution, the transparent resin layer is a composite of sticking material layer/plastic film)

c) Sticking material layer/(second face) electrically conductive layer (first face)/sticking material layer/plastic film/anti-reflection layer (in this constitution, the transparent resin layer is a sticking material layer)

d) Sticking material layer/plastic film/adhesive material layer/(second face) electrically conductive layer (first face)/sticking material layer/near infrared ray shielding layer/plastic film/anti-reflection layer (in this constitution, the transparent resin layer is a composite of sticking material layer/plastic film/adhesive material layer)

e) Sticking material layer/near infrared ray shielding layer/plastic film/(second face) electrically conductive layer (first face)/sticking material layer/plastic film/anti-reflection layer (in this constitution, the transparent resin layer is a composite of sticking material layer/near infrared ray shielding layer/plastic film)

Of the above constitution, the near infrared ray shielding function and orange light shielding function may be disposed as independent layers to each other, a layer having both the functions together may be disposed, or these functions may be imparted to a plastic film, sticking material layer or adhesive material layer.

(Flat-Panel Display)

The flat-panel displays that can be applied include, for example, a variety of flat-panel displays such as a PDP, LCD, plasma address liquid crystal display panel (PALC) and field emission display (FED) For example, a PDP is produced by inserting a partition wall for forming a number of discharging cells into between the two glass substrates of back and front substrates to form a discharging electrode within the discharging cells, forming each red-, green- or blue-emitting fluorescent material film within each discharging cell, and encapsulating a gas containing xenon (Xe) within the discharging cells. A fluorescent material within such discharging cells is selectively emitted by discharging to be capable of indicating full color.

On the visible side of such flat-panel display, a front filter is normally disposed for the purposes of the reflection prevention of external light, the shielding electromagnetic wave generated from a flat-panel display, etc. With a flat-panel display of the present invention, a flat-panel display member as described above of the present invention is disposed as a front filter on the visible side of the flat-panel display body. Herein, the flat-panel display body refers to a primary member of the flat-panel display containing an indication panel and the one with state in which a front filter is not attached thereto. In addition, when disposed on a flat-panel display body, a flat-panel display member of the present invention is disposed such that the first face of the flat-panel display member is outside and that the second face is on the flat-panel display body side.

A flat-panel display of the present invention having disposed on the visible side a flat-panel display member of the present invention restrains the reflection of external light by the anti-reflection layer of the first face of the flat-panel display member and shields generated electromagnetic waves by the connection to the external electrode using the electrically conductive layer and electrode. In particular, where PDP is used, the use of a flat-panel display member having imparted thereto near infrared ray shielding function and orange light shielding function can preferably prevent malfunctions of peripheral electronic equipment and preferably improve color purity.

A flat-panel display of the present invention preferably closely affixes the second face side of a flat-panel display member to the flat-panel display body. For example, in the case of PDP, the second face side of a flat-panel display member is closely disposed on the visible side of the flat-panel display body and thus a front substrate. Making such a construction prevents the reflection of light at the interface between the flat-panel display member and flat-panel display and restrains ghosts of external light, thereby improving visibility.

Moreover, as another aspect, a flat-panel display member can be laminated to a high rigid substrate such as glass or polycarbonate and then disposed on the visible side of the flat-panel display body as well. In this case, the effect of protection of a flat-panel display is improved.

(Method of Producing a Flat-Panel Display Member)

A method of producing a flat-panel display member of the present invention includes a first step of obtaining a laminate having an anti-reflection layer on a first face of the electrically conductive layer and a transparent resin layer on a second face, a second step of forming a cavity reaching the electrically conductive layer or the transparent resin layer from the outermost surface of a first face side of the laminate in a peripheral portion of the laminate, and a third step of filling an electrode in the cavity.

In the above first step, a laminate is obtained that has at least an anti-reflection layer, an electrically conductive layer and a transparent resin layer in order listed. The methods of obtaining a laminate that can be employed as appropriate include well-known methods such as laminating, thermal pressing, pressure heating, reduced-pressure heating, coating and sputtering. A method of continuously laminating in a roll form at least two of an electrically conductive layer, an anti-reflection layer and a transparent resin layer is preferred in that yield can be improved and a lead time can be shortened. Herein, "continuously laminating in a roll form" is that two or more lengthy films supplied in a roll form are continuously laminated to each other. After lamination, the laminate may be windingly taken in a roll form or cut in a sheet form on the same line as the line subsequent to the lamination step.

When an electrically conductive layer, an anti-reflection layer and a transparent resin layer can be all formed in a film form in advance, the three are continuously laminated at the same time in a roll form, or one of the anti-reflection layer and the transparent resin layer is continuously laminated in a roll form and then further the other is continuously laminated in a roll form to thereby be capable of producing a flat-panel display member at a high efficiency.

When a sticking material is used as a transparent resin layer, a sticking material formed in a film form may be used and continuously laminated to an electrically conductive layer in a roll form, or the sticking material may be applied directly onto the electrically conductive layer.

In addition, when a plastic film is used as a transparent resin layer, a layer produced by laminating in advance an electrically conductive layer onto a plastic film as a supporter may be used. An anti-reflection layer is continuously laminated to the laminated film in a roll form to be capable of producing a flat-panel display member at a high efficiency.

The anti-reflection layer preferably uses a film-like anti-reflection layer having formed thereon a functional layer having an anti-reflection function, an anti-glare function or an anti-reflection anti-glare function on a supporter. An electrically conductive layer may be continuously laminated to an anti-reflection layer in a roll form, or an anti-reflection layer may be directly formed on an electrically conductive layer.

When lamination is continuously implemented in a roll form, lamination is preferably carried out under reduced pressure atmosphere. For example, lamination is carried out in a vacuum chamber capable of maintaining reduced pressure conditions. Implementation of lamination under reduced pressure can effectively prevent mixing of bubbles in between layers, whereby a transparent flat-panel display member having a low haze value can be obtained. An air pressure when lamination is carried out is preferably 20 kPa or less in order to effectively prevent mixing of bubbles, more preferably 15 kPa or less. The lower limit of an air pressure is preferably about 100 Pa from the viewpoint of the time reaching a set pressure or the like. When bubbles are mixed, it is needed that the laminate is heated and pressurized in an autoclave or the like for a long time (generally 30 minutes or more) to make fine or disperse the bubbles mixed in the laminate and make the laminate transparent. Fabricating a laminate by lamination under a reduced pressure atmosphere can prevent mixing of bubbles and omit autoclave treatment, so productivity is greatly improved.

A roll-shaped, laminated laminate can also be formed in an arbitrary size. Molding of a laminate can utilize well-known methods such as punching and sheet cutting using a cutting blade of a metal, ceramic or the like or an output power blade such as water pressure or laser. For the purpose of the protection of a flat-panel display, when the above laminate is laminated to a high rigid substrate, a roll-shaped laminate is laminated to a high rigid substrate in roll-to-sheet to cut the sheet at an end face of the high rigid substrate, thereby being capable of producing a flat-panel display member at a high efficiency.

The second step forms a cavity reaching the electrically conductive layer or the transparent resin layer from the outermost surface of the first face side of the laminate in the laminate obtained in the first step. Herein, a "cavity" refers to a pore-like or groove-like cavity disposed on the first face side of the flat-panel display member.

The methods of forming a cavity that are preferably used include a method of carrying out a half cut reaching the electrically conductive layer or the transparent resin layer from the outermost surface of the first face side of the laminate. A half cut can be performed using a cutting blade of a metal, ceramic or the like or an output power blade such as water pressure or laser. When a cut blade is used, for the purpose of the formation of a cavity of desired shape, a step is needed that forms a cut by means of a cut blade on both sides of a portion in which a cavity is formed and then carries out a detachment of from the outermost surface of the first face side of the laminate to the electrically conductive layer or the transparent resin layer.

On the other hand, when a cavity is formed by a laser, an organic substance of a portion irradiated with a laser is melt, evaporated or combusted, only the radiation of a laser to the laminate forms a cavity. As a result, the productivity is beneficially improved as compared with the method using a cut blade since a detachment step is not needed.

The shape of an electrode formed in the third step is substantially equal to the shape of the cavity. Hence, in the formation of the cavity, the cavity is preferably formed in such a manner that the width at the height position of the outermost surface is larger than the width at the bottom. Herein, the "width" at the bottom refers to the width of the cavity at the depth position of 95% of the depth to the deepest portion from the outermost surface of the first face side of a flat-panel display member at a portion where the depth of the cavity in the thickness direction of the flat-panel display member is deepest. In addition, the cross-sectional area a of the cavity in the outermost surface and the cross-sectional area b of the cavity in the bottom preferably satisfies $1<a/b<5$. The ratio more preferably satisfies $1.2<a/b<3$. Setting the shape of a cavity in the ranges can preferably form the shape of an electrode formed in the third step. Herein, the cross-sectional area on the bottom is as defined above.

When a cavity is formed by means of a laser, the adjustment of a focus position, output and a scanning speed (head speed) of a laser can control the shape of a cavity. Therefore, a cavity for forming an electrode that satisfies equation (1) or (2) as described above can be efficiently formed. In the formation of a cavity of a shape previously described in a laminate primarily having a resin by means of a laser, the focus of the laser is preferably set at a position separated from the outermost surface in the height direction. For example, with the focus position of a laser being set at a position of from 2 to 20 mm separated from the outermost surface in the height direction, the adjustment of the output of the laser or the scanning speed enables the formation of a cavity suitable to the present invention as described above. The focus position of a laser is preferably set at a position of from 3 to 15 mm separated from the outermost surface in the height direction. The output sources of lasers include iodine, YAG, $CO_2$ and the like; the source can be selected as appropriate depending on a desired output.

A method of producing a flat-panel display member of the present invention fills an electrically conductive material in a cavity formed in the second step in the third step to form electrode. The methods of filling an electrically conductive material that can be used include a method of printing by use of a plate produced by shaping the electrically conductive paste fitting with the surface shape of a cavity, a method of applying electrically conductive paste with a dispenser, and the like. In particular, the dispenser applying method is preferably used from the viewpoints of high material efficiency and ability of non-contact application. With the dispenser applying method, a method of discharging electrically conductive paste from a capsule having one or a plurality of discharging nozzles is preferably used. The shape of the discharging portion may be any shape of a flat plate, nozzle, needle and the like. The shape of the discharging nozzle may be any shape of a circle, ellipse, slit, and the like.

When electrically conductive paste is discharged from a capsule in the dispenser applying method, methods such as constant pressure discharging that involves continuously pressurizing electrically conductive paste at a constant range of pressure and discharging the electrically conductive paste at its pressure, or constant volume discharging that involves continuously extruding a constant volume of an electrically conductive paste filled in a syringe or the like, etc. are preferably employed. This can keep constant the discharging amount of electrically conductive paste. Electrically conductive paste, when containing a volatile substance such as a solvent, is dried after filling to be capable of forming an electrode.

In the present invention, in the above first step, a laminate with a cover film having the cover, film is preferably further placed on the outermost surface of the first face side of the laminate.

The cover film protects the outermost surface of the first face side of an electrically conductive layer, is laminated on the outermost surface for the purpose of not causing defects, etc., and finally detached and removed. In the present invention, the anti-reflection layer is preferably the outermost surface of a laminate, so description will be given here by means of an anti-refection layer in place of an outermost surface. The time when a cover film is laminated on an anti-reflection layer is preferably prior to laminating an electrically conductive layer to an anti-reflection layer, particularly preferably after an optically functional layer of anti-reflection properties is formed on a supporter such as a plastic resin film and before the resulting anti-reflection layer is windingly taken in a roll form. The time when a cover film is detached and removed is preferably after a flat-panel display member is placed in a flat-panel display body.

In the present invention, the thickness of a cover film is suitably from 20 to 200 µm, preferably from 30 to 100 µm. The cover film can utilize a variety of plastic films, and examples include polyester films such as a polyethylene terephthalate film, polyolefin films such as a polyethylene film, polypropylene film and polybutylene film, polyacetyl cellulose films, polyacryl films, polycarbonate films, epoxy films, polyurethane films, and the like. Of these, polyester films and polyolefin films are preferably used.

The cover film is finally detached and removed from a flat-panel display member, so a detachable sticking material or adhesive material is used by lamination. Alternatively, when a film having sticking properties is used as a cover film, a sticking material or the like is not needed.

In addition, the method of producing the above cover film is an appropriate method for forming a protruded shaped electrode from the outermost surface of the first face side.

Figure 19:
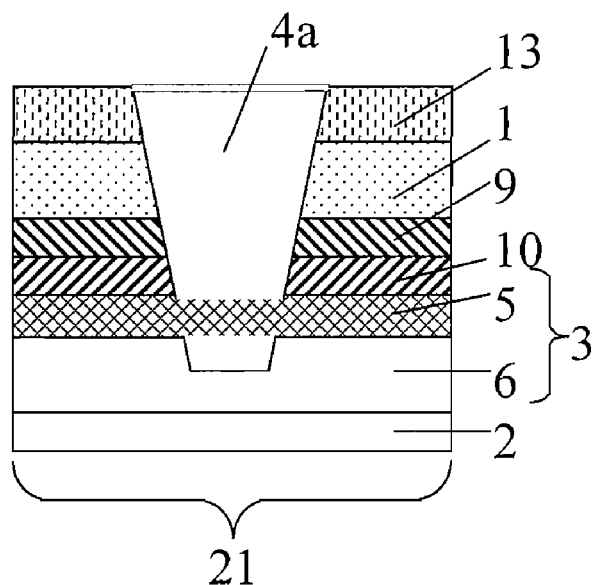
FIG. 19 is a schematic sectional view in a peripheral portion of an example of a laminate 2 constituting a flat-panel display member of the present invention.
Figure 20:
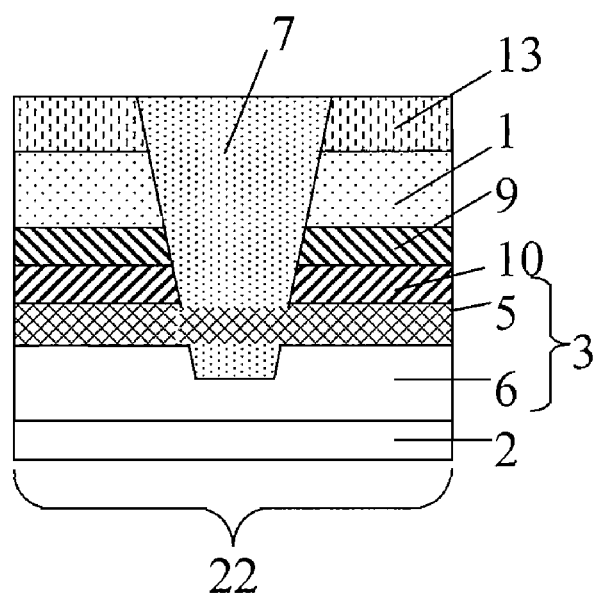
FIG. 20 is a schematic sectional view in a peripheral portion of an example of a flat-panel display member of the present invention.

In a state in which a cover film is laminated, in the second step, a cavity is formed that reaches the above electrically conductive layer or the above transparent resin layer from the surface of the cover film. A schematic diagram indicating this state is shown in FIG. 19. Subsequently, in the third step, the cavity is filled with an electrically conductive material such as electrically conductive paste. A schematic diagram indicating this state is shown in FIG. 20. Due to the fact that the electrically conductive material is filled until the position of the cover film, the electrode is protruded by the thickness of the cover film as compared with the anti-reflection layer. Thereafter, the detachment and removal of the cover film enables the formation of the electrode protruded from the outermost surface of the first face side. The height of the protruded portion of the electrode is arbitrarily adjusted by adjusting the thickness of the cover film or the filled amount of electrically conductive material. For example, when an electrically conductive material is filled until the outermost surface of a cover film, the height of the protruded portion of the electrode becomes substantially equivalent to the thickness of the cover film. When an electrically conductive material is filled until about 50% of the thickness of a cover film, the height of the protruded portion of the electrode becomes the height of about 50% of the thickness of the cover film.

Additionally, in the second step, a cavity is preferably formed by means of a laser. In this case, both ends of the cavity rise to form a bank in some cases. In the third step, filling an electrically conductive material until the bank of the cavity allows the protruded portion of the electrode to be still higher than the thickness of the cover film. The formation of the bank of such cavity is effective in the case where a relatively thin cover film is used since the protruded portion of the electrode can be larger than the thickness of the cover film.

The cover film is finally detached and removed from the flat-panel display member; the protruded portion of the electrode formed as described above remains in substantially the same shape after the cover film is detached and removed.

One aspect of the present invention forms electrodes of the present invention in two sides facing each other and forms electrodes in which the electrically conductive layer is exposed in the other two sides facing each other. In this aspect, in the first step, electrodes in which the electrically conductive layer is exposed in two sides facing each other are formed by use of a roll-shaped laminate fabricated by continuously laminating an anti-reflection layer narrower in width than the electrically conductive layer. Next, in the second and third steps, electrodes of the present invention are formed in the remaining two sides.

Another aspect of the present invention forms electrodes of the present invention in three sides and forms an electrode in which the electrically conductive layer is exposed in the other one side. This aspect is suitable for the case where a flat-panel display member is two-side chamfered in the width direction of a laminate. In other words, electrodes in which the electrically conductive layer is exposed are formed in two sides facing each other as in the above aspect, and then the laminate is slit into a half width. This makes it possible to obtain a laminate having an electrode in which an electrically conductive layer is exposed on one side, so electrodes of the present invention are formed in the remaining three sides by the above second and third steps. Alternatively, electrodes of the present invention are first formed by the above second and third steps and then the laminate may be slit into a half width.

Still another aspect forms electrodes of the present invention in all the four peripheral portions. This aspect is suitable when a laminate is used that is produced by continuously laminating an anti-reflection layer having a substantially the same width as that of the electrically conductive layer in a roll form.

(Method of Producing a Flat-Panel Display)

A flat-panel display of the present invention is obtained by disposing a flat-panel display member on the visible side of the flat-panel display body. Here, after the flat-panel display member of the present invention is obtained by the above method, the flat-panel display member may be placed on the visible side of the flat-panel display body, or after a laminate constituting the flat-panel display member of the present invention is placed in the flat-panel display body, an electrode of the present invention may be formed by the above method.

For the latter, there are a method of placing a laminate obtained by the above first step in a flat-panel display body and then forming a cavity and an electrode by means of the second and third steps and a method of placing a laminate having a cavity obtained by means of the second and third steps in a flat-panel display body and then forming an electrode by the above third step.

A preferred aspect of a method of producing a flat-panel display of the present invention is a method including a step of disposing on the visible side of a flat-panel display body a laminate having at least an anti-reflection layer, an electrically conductive layer and a transparent resin layer, having the anti-reflection layer disposed on a first face of the electrically conductive layer, and having the transparent resin layer disposed on a second face on the other side of the first face of the electrically conductive layer, a step of forming a cavity reaching the above electrically conductive layer or the above transparent resin layer from the outermost surface of the first face side of the laminate in the peripheral portion of the above laminate, a step of forming an electrode by filling the cavity with a conductive material, and a step of connecting the electrode to an external electrode.

The methods of disposing a laminate on the visible side of a flat-panel display body that can be used include a roll-to-sheet technique for closely disposing a roll-shaped laminate while cutting it into a substantially rectangular sheet shape, or a sheet-to-sheet technique for closely disposing a laminate formed in a substantially rectangular sheet shape in advance. Cutting out and molding a laminate can use a well-known method such as a method of sheet cutting by use of a cut blade of a metal, ceramic or the like, or an output power blade such as water pressure or a laser, or a method of punching. In particular, the roll-to-sheet contact technique uses a roll-shaped laminate, so the step can be simplified; the technique is preferred due to excellent productivity from the viewpoints of setting of a laminate and ease of tension adjustment of a laminate during contact placement, etc.

The methods of contact placement of a laminate that can be used as appropriate include well-known methods such as laminating by pressing with a roll, thermal pressing, pressure heating and reduced pressure heating, and laminating by use of a roll is preferably used in terms of universal use and simplification of the step. With a laminate used in a manufacturing method of the present invention, the largest value of deviations of end positions of an electrically conductive layer and anti-reflection layer in at least two sides facing each other is preferably 1 mm or less. Making the laminate such a shape restrains the steps of laminate ends and enables uniform laminating when the laminate is made to be a display panel and is laminated.

A step of forming a cavity in a laminate and a step of forming an electrode by filling an electrically conductive material in the cavity can make use of a constitution and a method described in a flat-panel display member and its manufacturing method of the prevent invention previously.

Another aspect of a method of manufacturing a flat-panel display of the present invention is an aspect in which, in the above aspect, the step of forming the cavity in the laminate is implemented before the step of disposing the above laminate on the visible side of the flat-panel display body. In other words, the aspect is a method of manufacturing a flat-panel display including a step of forming a cavity reaching an electrically conductive layer or a transparent resin layer from the outermost surface of a first face side of a laminate in a peripheral portion of the laminate having at least an anti-reflection layer, the above electrically conductive layer and the above transparent resin layer, having the anti-reflection layer disposed on the first face of the electrically conductive layer, and having the transparent resin layer disposed on a second face on the other side of the first face of the electrically conductive layer, a step of disposing the laminate having formed therein the above cavity on the visible side of a flat-panel display body, a step of forming an electrode by filling the cavity with a conductive material, and a step of connecting the electrode to the external electrode. The method of disposing a laminate on the visible side of a flat-panel display body, the step of forming a cavity in a laminate, and the step of filling the cavity with an electrically conductive material to form an electrode can make use of the above configuration and method.

Another aspect of a method of producing a flat-panel display of the present invention uses a laminate with a cover film as described above. That is to say, on the visible side of a flat-panel display body, a laminate with a cover film having the cover film is further disposed on the outermost surface of the first face. A cavity reaching the above electrically conductive layer or the above transparent resin layer from the surface of the cover film is formed in the laminate, as described above. Subsequently, an electrode is formed as in the above and then the above cover film is detached and further the electrode is connected to an external electrode.

Still another aspect of a method of producing a flat-panel display of the present invention implements the formation of a cavity reaching the above electrically conductive layer or the above transparent resin layer from the surface of a cover film in a laminate with a cover film further having the cover film on the outermost surface of the first face side, as in the above case. Next, the laminate with the cover film having formed the cavity therein is disposed on the visible side of the flat-panel display body. Subsequently, an electrode is formed as described above, and then the above cover film is detached and further the electrode is connected to an external electrode.

The material, thickness, etc. of the cover film are as described above. The methods of forming a cavity and an electrode, and the like also use the method as described above.

The electrode can be electrically connected to the external electrode using a well-known electrically conductive member such as an electrically conductive tape, electrically conductive adhesive, electrically conductive paint, or electrically conductive molded part. The external electrode of a flat-panel display body is connected to a ground, so the electrode of the flat-panel display member is communicated with the external electrode; earthing can shield electromagnetic waves generated from the flat-panel display.

Use of the method of producing a flat-panel display as described above can produce a flat-panel display excellent in electromagnetic wave shielding performance at high productivity.

EXAMPLES

The present invention will be set forth by means of examples in more detail hereinafter; however, the invention is by no means limited to these examples.

Additionally, each physical property was determined by the following method.

(1) Surface Resistivity

The resistance was measured using the surface resistance tester "Loresta" available from Mitsubishi Chemical Corporation by the 4-pin probe method.

(2) Reflectance

The reflectance of a visible region wavelength (380 to 780 nm) was measured using the spectrophotometer "U-3400" available from Hitachi, Ltd. and the luminous reflectance (Y) was calculated according to the CIE1931 system.

(3) Transmittance

The light transmittance of a desired wavelength was measured using the spectrophotometer "U-3400" available from Hitachi, Ltd.

(4) Calculation of A/B

The cross sections of five points of each electrode were photographed by means of the electron microscope "SE-2400" available from Hitachi, Ltd. The product of an average value of a width at the height position of the outermost surface of each electrode and the length of an electrode was taken as the cross-sectional area at the outermost surface of each electrode The sum of cross-sectional area at the outermost surface of each electrode was evaluated and was taken as the cross-sectional area A of an electrode at the outermost surface of a first face side of a flat-panel display member. In addition, the product of an average value of a width at a cross section of the depth of 95% of the deepest portion of each electrode and the length of an electrode was taken as the cross-sectional area of the bottom of each electrode. The sum of the cross-sectional area of the bottom of each electrode was evaluated and taken as the cross-sectional area B at the bottom of an electrode of a flat-panel display member. From A and B thus obtained, the ratio of A/B of both was calculated.

In addition, with Examples 10 to 13 and Comparative Example 6, after a laminate was laminated to a display panel, an electrode was formed and then the laminate was dispatched from the display panel and A/B was measured.

(5) Ground Performance (Resistance Values Between Electrodes)

A resistance value between electrodes disposed on two sides facing each other was measured by the 2-pin probe method using the resistance measuring apparatus "Pocket Multi-meter" available from Multi Measuring Instruments Sales Co., Ltd.

(6) Electromagnetic Wave Shielding Performance

The front filter of a plasma display television "42PX-20" available from Matsushita Electric Industrial Co., Ltd. was taken off and flat-panel display members obtained in the examples and comparative examples were set such that the first face was on the visible side and the second face was on the display side. In addition, in Example 7 using an adhesive as a transparent resin layer, the sticking material face of a flat-panel display member was affixed to the visible side of a display. After adhesion of the flat-panel display member to "42PX-20", an electrode disposed in a peripheral portion of the flat-panel display member was connected to the external electrode of the cylinder of "42PX-20" to obtain a flat-panel display. An antenna available from Schwarzbeck was placed in an anechoic chamber (3 m method) available from RIKEN CORPORATION and the emission of frequencies of from 30 to 88 MHz radiated from "42PX-20" was measured using an EMI test receiver available from Rohde & Schwarz and a spectrum analyzer available from Agilent Technologies. For the satisfaction of the FCC standard (class B), a tolerance is 40 dB or less.

(7) Near Infrared Ray Shielding Performance

With the flat-panel display fabricated in the above item (6), a hard disk recorder (HG-02S) available from Sharp Corporation using an infrared remote controller was disposed 1 m front the flat-panel display and operated simultaneously with the flat-panel display. The flat-panel display was evaluated on the basis of the presence or absence of the generation of malfunctions.

(8) RGB Color Purity

With the flat-panel display fabricated in the above item (6), the RGB chromaticity values were measured using a color analyzer available from KONICA MINOLTA HOLDINGS, INC. and plotted against the xy coordinate. The area of the xy coordinate was compared with that of the RGB chromaticity coordinate by the NTSC system and the area of both being overlapped was evaluated. The larger the overlap ratio of the NTSC system to the RGB color coordinate, the better the color purity.

(9) Haze Value

The measurement of the haze value of a flat-panel display member was carried out according to JIS K 7136 (2000).

In addition, the materials, apparatuses, and processing methods are in the following. For samples with a cover film, the haze value is measured after the caver film is detached.

A. Electrically Conductive Layer

A copper mesh film (laminated film of a PET film supporter and copper mesh layer: thickness 150 μm, surface resistivity 0.03Ω/□, copper mesh thickness 10 μm, line width 12 μm, line interval 300 μm) was used.

B. Anti-Reflection Layer (Anti-Reflection Film)

The AR film "Realook" available from Toray Industries, Inc. (PET film supporter, thickness 100 μm, reflectance 0.5%) was used.

C. Transparent Resin Layer

Heat Air Dryable Sticking Material

An acrylic sticking paint available from TOAGOSEI CO., LTD was used.

UV Curable Sticking Material

The acrylic sticking paint "Acrylic Syrup" available from Soken Chemical & Engineering Co., Ltd was used.

Film-Like Sticking Material

The acrylic sticking material "TD43A" available from TOMOEGAWA CO., LTD (sticking material thickness 25 μm: a material in which, as a separate film, a heavy detachment processed PET film was laminated on one side of a sticking material and a light detachment processed PET film was laminated on the other side) was used.

D. Electrically Conductive Paste

The silver paste "DOTITE" available from FUJIKURA KASEI CO., LTD was used.

E. Glass Substrate

Soda glass (570 mm×980 mm, thickness 2.5 mm) available from CENTRAL GLASS CO., LTD. was used.

F. Near Infrared Ray Shielding Layer (also Having Orange Light Shielding Function)

A paint was used that was produced by mixing phthalocyanine pigment and diimonium pigment as near infrared ray absorbing pigments and tetraazaporphyrin as an orange light absorbing pigment with an acrylic resin.

G. Color Sticking Material

The color sticking paint "TD43B" (acrylic sticking material, pigment dissolved type, hot air drying type) available from TOMOEGAWA CO., LTD was used.

H. Cover Film

E-MASK IP300 (laminating a 5 μm fine sticking layer to a 38 μm PET film) available from NITTO DENKO CORPORATION was used.

I. Laminator

Sheet Laminator

A sheet laminator available from Taisei Laminator Co., Ltd. was used.

Roll Laminator

A roll laminator available from MCK Co., Ltd was used.

Auto Cut Laminator

An auto cut laminator available from SUN-TECH CO., LTD was used.

J. Slitter

A film slitter available from Inoue Kinzoku Kogyo CO., LTD was used.

K. Coater

A flexible coater available from YASUI SEIKI CO., LTD was used.

L. Dryer

An IR drying furnace available from NGK INSULATORS, LTD and a hot air drying furnace available from DABAI CO., LTD. were used.

M. UV Irradiator

A UV irradiator available from JAPAN TECHNOLOGY SYSTEM CORPORATION was used.

N. Laser Cutter

A laser cutter ($CO_2$ laser head, maximum output 200 W) available from Co-Max Co., LTD. was used.

O. Dispenser

A dispenser available from MUSASHI ENGINEERING, INC. was used.

P. Autoclave Processing

After a laminate or a flat-panel display member was fabricated, it was autoclave processed at 60° C. and 0.7 MPa for 50 to 70 minutes such that the haze value (JIS K 7136; 2000) of the laminate or flat-panel display member became about 2% using an autoclave apparatus "HP-120150AA" available from KYOI ENGINEERING CORPORATION. However, in Examples 9, 12, 13 and 14, lamination under reduced pressure led to a haze value of about 2% of the laminate or flat-panel display member, so autoclave processing was omitted.

In addition, in the examples below, of intermediate products of flat-panel display members, a laminate obtained by laminating anti-reflection layer/electrically conductive layer/transparent resin layer was taken as laminate 1, and a laminate having a cavity disposed in laminate 1 was taken as laminate 2.

Example 1

First, the light detachment processed PET film of a 570×950 mm film-like sticking material was detached, and then the sticking face was affixed to the PET film face of a 570×950 mm anti-reflection film using a sheet laminator, with the positions of the ends being put together, to thereby obtain an anti-reflection film with a sticking material. Next, the heavy detachment processed PET film of the film-like sticking material of the above anti-reflection film with the sticking material was detached and the sticking face was affixed to the copper mesh face of a 570×980 mm copper mesh film by means of a sheet laminator to obtain laminate 1. FIG. 1 is a schematic plan view of laminate 1 of Example 1. The deviations of the end positions of the copper mesh film and the anti-reflection film with the sticking material were each 0.2 mm on the two long sides and each 15 mm on the two short sides in the peripheral portion of laminate 1 of Example 1, and the ends of the two short sides were exposed on their copper mesh surfaces of the copper mesh film. The production time per sheet of laminate 1 was 60 seconds.

Figure 2:
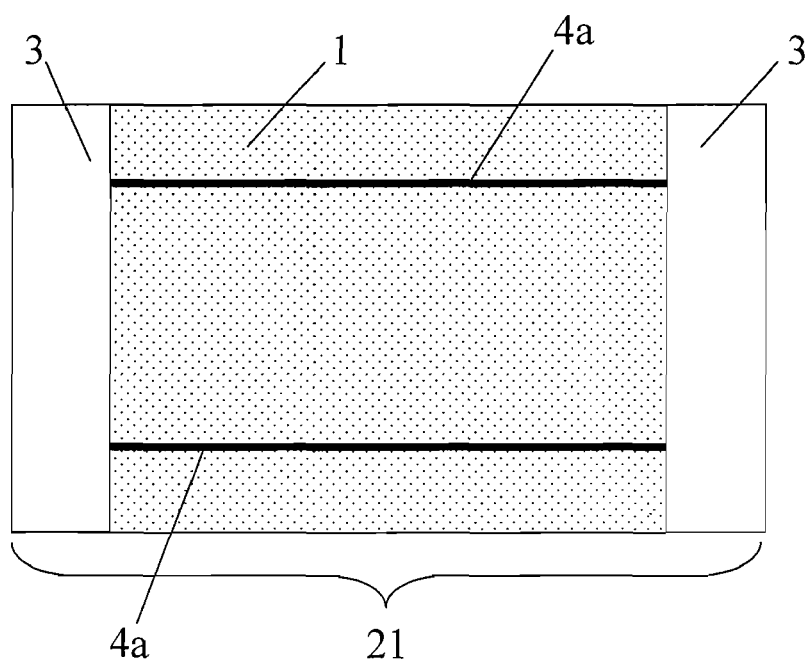
FIG. 2 is a schematic plan view indicating an example of a laminate 2 constituting a flat-panel display member of the present invention.
Figure 3:
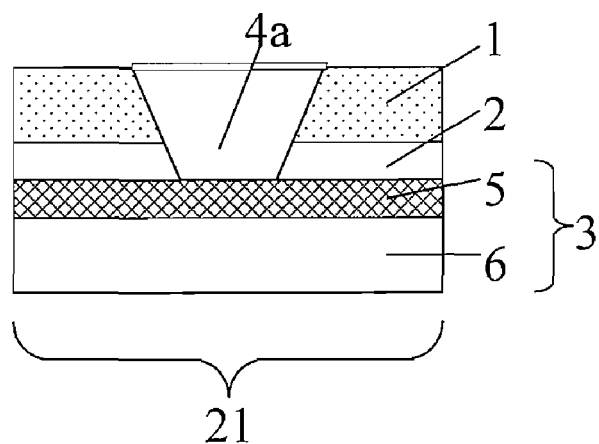
FIG. 3 is a schematic cross sectional view in a peripheral portion of an example of a laminate 2 constituting a flat-panel display member of the present invention.

Subsequently, laminate 1 was fixed to a laser cutter, and cavities were formed in a line shape of a length of 960 mm by irradiating 10 mm inside the ends of the two long sides of laminate 1 with a laser of an output of 20% and a head speed of 1500 cm/min from the outermost surface (outermost surface of a first face side) of the anti-reflection film of laminate 1 to obtain laminate 2. FIG. 2 is a schematic plan view of laminate 2 of Example 1; FIG. 3 is a schematic sectional view, in the thickness direction, of a portion in which a cavity is formed. The cavity was formed from the outermost surface (outermost surface of the first face side) of the anti-reflection film to the copper mesh surface of the copper mesh film, and the copper mesh surface was exposed.

Figure 4:
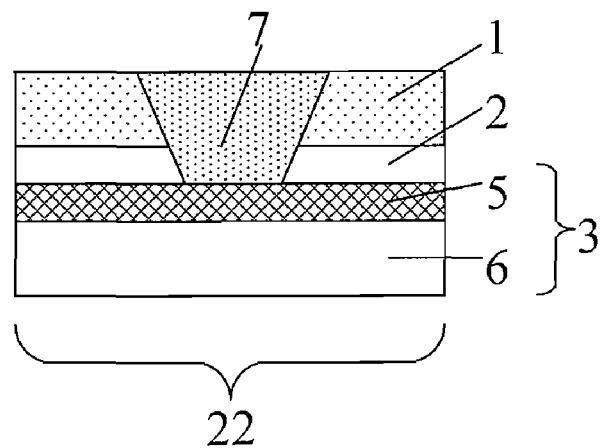
FIG. 4 is a schematic cross sectional view in a peripheral portion of an example of a flat-panel display member of the present invention.

Subsequently, electrically conductive paste was applied to the cavity portion of laminate 2 by means of a dispenser and then dried in an IR drying furnace to form an electrode and obtain a flat-panel display member of the present invention. FIG. 4 is a schematic sectional view, in the thickness direction, of a portion in which an electrode of the flat-panel display member of Example 1 is formed. The electrode was formed from the outermost surface of the anti-reflection film to the copper mesh surface of the copper mesh film. In addition, the average value of the width of the electrode at the height position of the outermost surface was 0.55 mm, the average value of the width of the electrode at the bottom was 0.37 mm, and the ratio (A/B) of the cross-sectional area A of the electrode at the outermost surface to the cross-sectional area B at the bottom was 1.5.

The resistance value between the two electrodes at the electrode surfaces of the flat-panel display member thus obtained was measured to obtain 0.9Ω. In addition, the resistance value between the two sides of a portion in which the copper mesh was exposed on the two short sides was measured to obtain 0.4Ω.

Example 2

Figure 5:
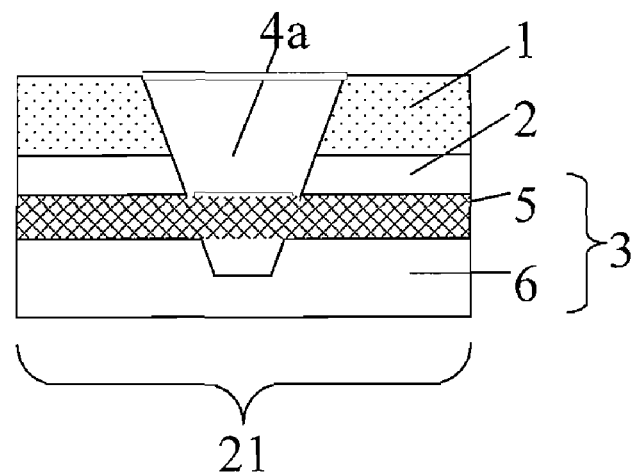
FIG. 5 is a schematic cross sectional view in a peripheral portion of an example of a laminate 2 constituting a flat-panel display member of the present invention.

A display member was obtained as in Example 1 with the exception that the laser irradiation conditions had an output of 30% and a head speed of 1300 cm/min. FIG. 2 is a schematic plan view of laminate 2 of Example 2; FIG. 5 is a schematic sectional view of a portion in which a cavity is formed in the thickness direction. The cavity was formed from the outermost surface (outermost surface of the first face side) of the anti-reflection film to a PET film (transparent resin layer) of the copper mesh film, and the copper mesh was exposed in all the directions.

Figure 6:
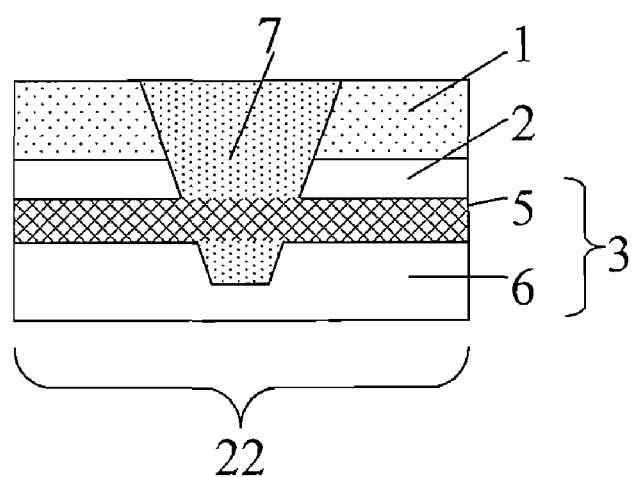
FIG. 6 is a schematic sectional view in a peripheral portion of an example of a flat-panel display member of the present invention.

Moreover, FIG. 6 is a schematic sectional view, in the thickness direction, of a portion in which an electrode of the flat-panel display member of Example 2. The electrode was formed from the outermost surface of the anti-reflection film to the PET film of the copper mesh film. In addition, the average value of the width of the electrode at the height position of the outermost surface was 0.60 mm, the average value of the width of the electrode at the bottom was 0.30 mm, and the ratio (A/B) of the cross-sectional area A of the electrode at the outermost surface to the cross-sectional area B at the bottom was 2.0. The resistance value between the two electrodes at the electrode surfaces of the flat-panel display member thus obtained was measured to obtain 0.5Ω. In addition, the resistance value between the two sides of a portion in which the copper mesh was exposed on the two short sides was measured to obtain 0.4Ω.

Example 3

Laminate 1 was obtained as in Example 1 with the exception that a 570×980 mm anti-reflection film and a 570×980 mm film-like sticking material were used. FIG. 7 is a schematic plan view of laminate 1 of Example 3. The largest value of the deviations at end positions of a copper mesh film and an anti-reflection film with a sticking material in the peripheral portion of laminate 1 of Example 3 was 0.3 mm.

Figure 8:
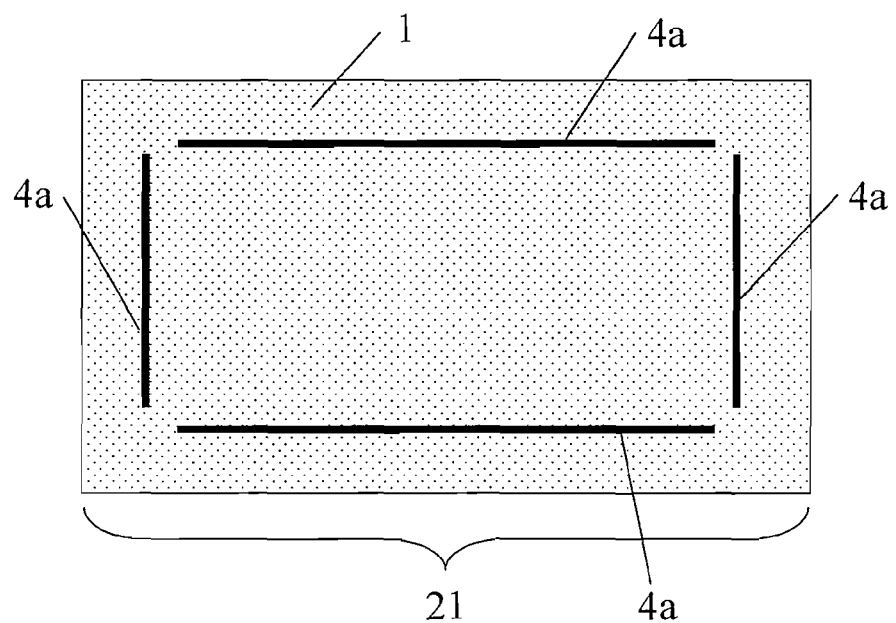
FIG. 8 is a schematic plan view indicating an example of a laminate 2 constituting a flat-panel display member of the present invention.

Next, laminate 1 was fixed to a laser cutter, and cavities were formed in a line shape of lengths of 956 mm in the two long sides and lengths of 546 mm in the two short sides by irradiating 10 mm inside the ends in the peripheral portion of laminate 1 with a laser of an output of 20% and a head speed of 1500 cm/min from the surface of the anti-reflection film of laminate 1 to obtain laminate 2. FIG. 8 is a schematic plan view of laminate 2 of Example 3; FIG. 3 is a schematic sectional view, in the thickness direction, of a portion in which a cavity is formed. The cavity was formed form the outermost surface of the anti-reflection film to the copper mesh surface of the copper mesh film and the copper mesh surface was exposed.

Subsequently, electrically conductive paste was applied to the cavity portion of laminate 2 by means of a dispenser and then dried in an IR drying furnace and the electrode was filled to obtain a flat-panel display member. FIG. 4 is a schematic sectional view, in the thickness direction, of a portion in which an electrode of the flat-panel display member is formed. The electrode was formed from the outermost surface of the anti-reflection film to the copper mesh surface of the copper mesh film. In addition, the average value of the width of the electrode at the height position of the outermost surface was 0.55 mm, the average value of the width of the electrode at the bottom was 0.37 mm, and the ratio (A/B) of the cross-sectional area A of the electrode at the outermost surface to the cross-sectional area B at the bottom was 1.5.

The resistance value between the electrodes at the electrode surfaces of the flat-panel display member thus obtained was measured to obtain 0.9Ω between the two long sides and 1.4Ω between the two short sides.

Comparative Example 1

A flat-panel display member was obtained as in Example with the exception that the cavity forming and electrode filling of laminate 1 were not carried out. The resistance value of the electrode surface of the flat-panel display member thus obtained was measured; however, the conduction was not obtained between the two long sides and the ground was not established.

Comparative Example 2

Figure 9:
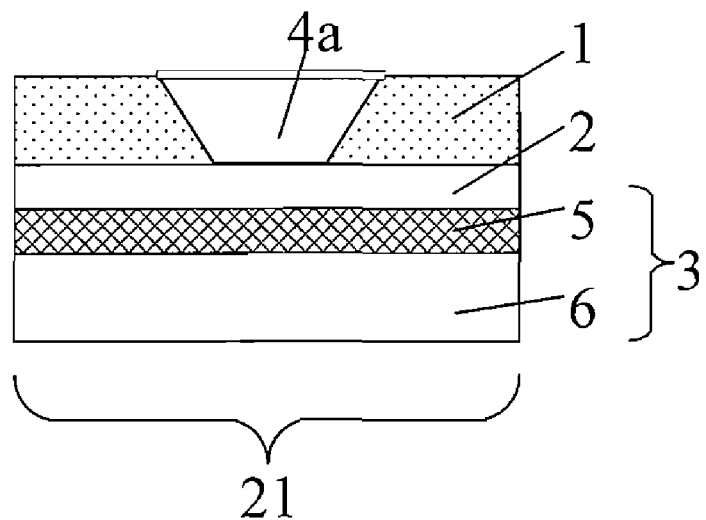
FIG. 9 is a schematic sectional view in a peripheral portion of a laminate 2 constituting a flat-panel display member of a comparative example.

A flat-panel display member was obtained as in Example 1 with the exception that the laser irradiation conditions were an output of 10% and a head speed of 2000 cm/min. FIG. 9 is schematic sectional view, in the thickness direction, of a portion in which a cavity of laminate 2 of Comparative Example 2 is formed. The cavity bottom did not reach the copper mesh surface of the copper mesh film and the copper mesh was coated with a film-like sticking material.

Figure 10:
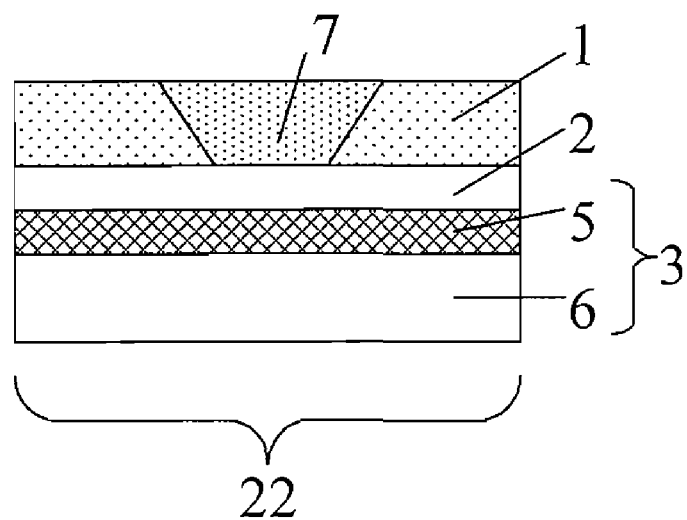
FIG. 10 is a schematic sectional view in a peripheral portion of a flat-panel display member of a comparative example.

Additionally, FIG. 10 is schematic sectional view, in the thickness direction, of a portion in which an electrode of the flat-panel display member of Comparative Example 2 is formed. The electrode did not reach the copper mesh of the copper mesh film. In addition, the average value of the width of the electrode at the height position of the outermost surface was 0.51 mm, the average value of the width of the electrode at the bottom was 0.39 mm, and the ratio (A/B) of the cross-sectional area A of the electrode at the outermost surface to the cross-sectional area B at the bottom was 1.3.

The resistance value between the electrodes at the electrode surface of the flat-panel display member thus obtained was measured; however, the conduction was not obtained and the ground was not established.

Example 4

Laminate 1 was fabricated as in Example 1 with the exception that a copper mesh film having a sold copper film portions of a width of 20 mm (copper foil portions without mesh processing) from each end in the peripheral portion of the four sides was used as the copper mesh film. Next, cavities were formed in the two long sides of laminate 1 as in Example 1 to obtain laminate 2. The cavity was formed from the outermost surface of the anti-reflection film (outermost of the first face side) to the solid copper film surface of the copper mesh film, and the solid copper film surface was exposed. Subsequently, electrically conductive paste was applied to the cavity as in Example 1 to form an electrode and obtain a flat-panel display member of the present invention. In addition, the average value of the width of the electrode at the height position of the outermost surface was 0.55 mm, the average value of the width of the electrode at the bottom was 0.37 mm, and the ratio (A/B) of the cross-sectional area A of the electrode at the outermost surface to the cross-sectional area B at the bottom was 1.5.

The resistance value between the electrodes of the two sides at the electrode surfaces was 0.4Ω. In addition, the resistance value between two side portions in which the solid copper film portions of the two short sides were not exposed was 0.2Ω.

Example 5

First, an acrylic sticking paint available from TOAGOSEI CO., LTD was applied to the PET film face of an anti-reflection film of a width of 1000 mm and a length of 1000 m using a flexible coater and dried in a hot air furnace, and then the anti-reflection film was slit into a width of 950 mm by means of a film slitter. The thickness of the sticking material was 25 μm. Next, the copper mesh face of a copper mesh film of a width of 1000 mm and a length of 100 m was affixed to the sticking face of the anti-reflection film using a roll laminator. Subsequently, the affixed film was slit into a width of 980 mm using a film slitter to obtain a roll of laminate 1.

Next, the roll of laminate 1 was cut into a length of 570 mm to obtain laminate. FIG. 1 is a schematic plan view of laminate 1 of Example 5. The deviations of the end positions of the copper mesh film in the peripheral portion of laminate 1 of Example 5 and the anti-reflection film were 0 mm on the two long sides and each 15 mm on the two short sides, and the ends of the two short sides were exposed on their copper mesh surfaces of the copper mesh film.

Subsequently, laminate 1 was fixed to a laser cutter, and cavities were formed in a line shape of a length of 960 mm by irradiating 10 mm inside the ends of the two long sides of laminate 1 with a laser of an output of 30% and a head speed of 1300 cm/min from the outermost surface (outermost surface of the first face side) of the anti-reflection film of lami-nate 1 to obtain laminate 2. FIG. 2 is a schematic plan view of laminate 2 of Example 5; FIG. 5 is a schematic sectional view, in the thickness direction, of a portion in which a cavity is formed. The cavity reached the PET film (transparent resin layer) of the copper mesh film from the outermost surface (outermost surface of the first face side) of the anti-reflection film, and the copper mesh surface was exposed in all the directions.

Subsequently, electrically conductive paste was applied to the cavity portion of laminate 2 by means of a dispenser and then dried in an IR drying furnace and the electrode was filled to obtain a flat-panel display member of the present invention. FIG. 6 is a schematic sectional view, in the thickness direction, of a portion in which an electrode of the flat-panel display member of Example 5 is formed. The electrode reached the PET film of the copper mesh film from the outermost surface of the anti-reflection film and was formed. In addition, the average value of the width of the electrode at the height position of the outermost surface was 0.60 mm, the average value of the width of the electrode at the bottom was 0.30 mm, and the ratio (A/B) of the cross-sectional area A of the electrode at the outermost surface to the cross-sectional area B at the bottom was 2.0.

The resistance value between the electrodes at the electrode surfaces of the flat-panel display member thus obtained was measured to obtain 0.5Ω. In addition, the resistance value between the two sides of a portion in which the copper mesh of the two short sides was exposed was measured to obtain 0.4Ω.

Example 6

First, an acrylic sticking paint available from TOAGOSEI CO., LTD was applied to the PET film face of an anti-reflection film of a width of 1000 mm and a length of 1000 m using a flexible coater and dried in a hot air furnace, and then the anti-reflection film was slit into a width of 950 mm by means of a film slitter. The thickness of the sticking material was 25 μm. Next, an acrylic sticking paint available from TOAGOSEI CO., LTD was applied to the PET film face of an anti-reflection film of a width of 1000 mm and a length of 1000 m using a flexible coater and dried in a hot air furnace. The thickness of the sticking material was 25 μm. Subsequently, the copper mesh face of the copper mesh film was affixed to the sticking material face of the above anti-reflection film using a roll laminator, and then the affixed film was slit into a width of 980 mm using a film slitter to obtain a roll of laminate 1.

Next, while the roll of laminate 1 was cut into a length of 570 mm, the sticking face was affixed to a glass substrate of 570×980 mm, with the positions of the ends being fit to each other, using an auto cut laminator to obtain laminate 1. FIG. 1 is a schematic plan view of laminate 1 of Example 6. The deviations of the end positions of the copper mesh film in the peripheral portion of laminate 1 of Example 6 and the anti-reflection film were 0 mm on the two long sides and each 15 mm on the two short sides, and the ends of the two short sides were exposed on their copper mesh surfaces of the copper mesh film.

Figure 11:
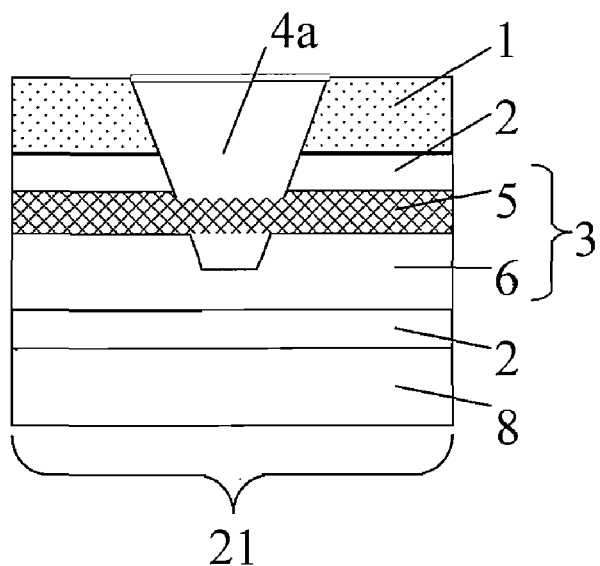
FIG. 11 is a schematic sectional view in a peripheral portion of an example of a laminate 2 constituting a flat-panel display member of the present invention.

Subsequently, laminate 1 was fixed to a laser cutter, and cavities were formed in a line shape of a length of 960 mm by irradiating 10 mm inside the ends of the two long sides of laminate 1 with a laser of an output of 30% and a head speed of 1300 cm/min from the outermost surface (outermost surface of the first face side) of the anti-reflection film of lami-nate 1 to obtain laminate 2. FIG. 2 is a schematic plan view of laminate 2 of Example 6; FIG. 11 is a schematic sectional view, in the thickness direction, of a portion in which a cavity is formed. The cavity reached the substrate PET film (transparent resin layer) of the copper mesh film from the outermost surface (outermost surface of the first face side) of the anti-reflection film, and the copper mesh layer was exposed.

Figure 12:
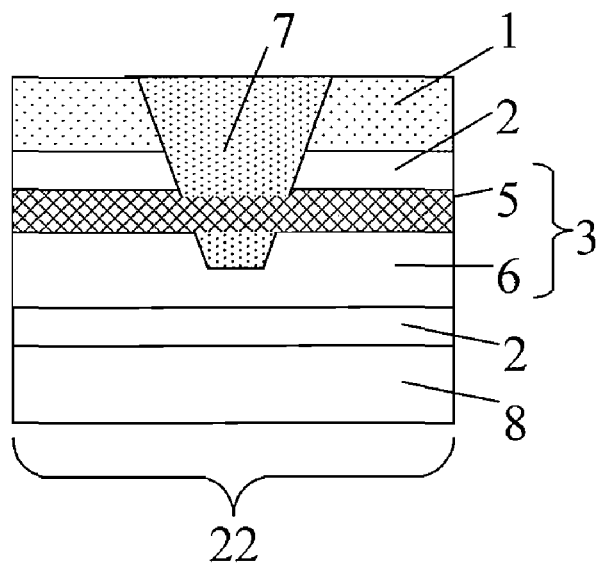
FIG. 12 is a schematic sectional view in a peripheral portion of an example of a flat-panel display member of the present invention.

Subsequently, electrically conductive paste was applied to the cavity portion of laminate 2 by means of a dispenser and then dried in an IR drying furnace and the electrode was filled to obtain a flat-panel display member of the present invention. FIG. 12 is a schematic sectional view, in the thickness direction, of a portion in which an electrode of the flat-panel display member of Example 6 is formed. The electrode reached the substrate PET film of the copper mesh film from the outermost surface of the anti-reflection film. In addition, the average value of the width of the electrode at the height position of the outermost surface was 0.60 mm, the average value of the width of the electrode at the bottom was 0.30 mm, and the ratio (A/B) of the cross-sectional area A of the electrode at the outermost surface to the cross-sectional area B at the bottom was 2.0.

The resistance value between the electrodes at the electrode surfaces of the flat-panel display member thus obtained was measured to obtain 0.5Ω. In addition, the resistance value between the two sides of a portion in which the copper mesh of the two short sides was exposed was measured to obtain 0.4Ω.

Comparative Example 3

Figure 13:
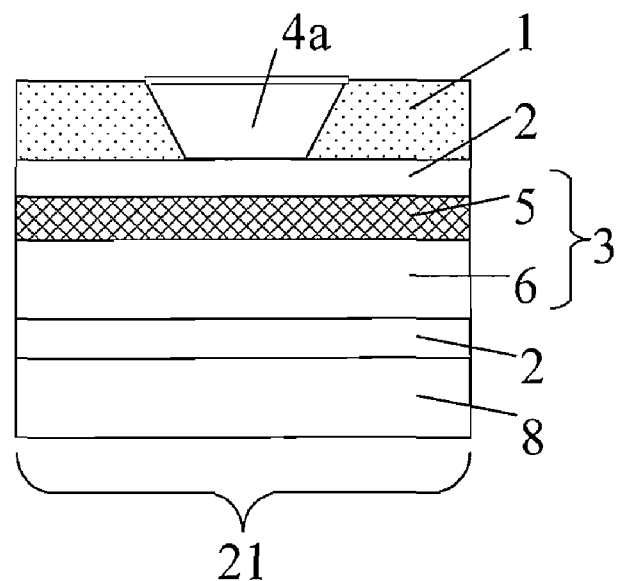
FIG. 13 is a schematic sectional view in a peripheral portion of a laminate 2 constituting a flat-panel display member of a comparative example.
Figure 14:
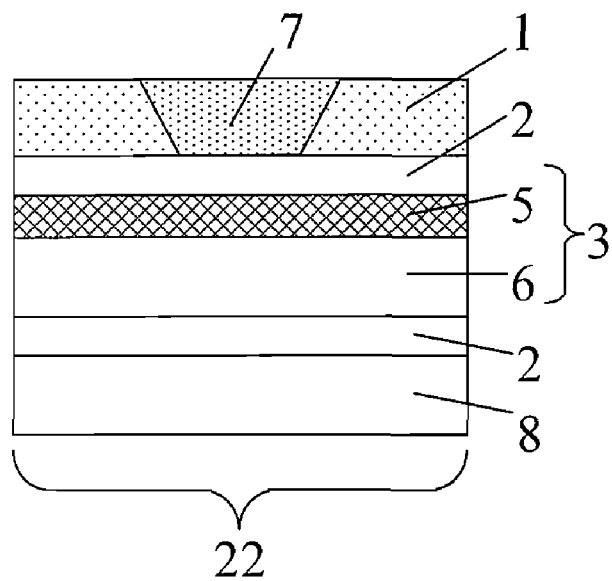
FIG. 14 is a schematic sectional view in a peripheral portion of an example of a flat-panel display member of a comparative example.

Laminate 2 and a flat-panel display member were obtained as in Example 6 with the exception that the laser irradiation conditions were an output of 10% and a head speed of 2000 cm/min. FIG. 13 is schematic sectional view, in the thickness direction, of a portion in which a cavity of laminate 2 of Comparative Example 3 is formed. The cavity bottom did not reach the copper mesh surface of the copper mesh film and the copper mesh was coated with a film-like sticking material. Additionally, FIG. 14 is schematic sectional view, in the thickness direction, of a portion in which an electrode of the flat-panel display member of Comparative Example 3 is formed. The electrode did not reach the copper mesh of the copper mesh film. In addition, the average value of the width of the electrode at the height position of the outermost surface was 0.51 mm, the average value of the width of the electrode at the bottom was 0.39 mm, and the ratio (A/B) of the cross-sectional area A of the electrode at the outermost surface to the cross-sectional area B at the bottom was 1.3.

The resistance value between the electrodes at the electrode surface of the flat-panel display member thus obtained was measured; however, the conduction was not obtained and the ground was not established. In addition, the resistance value between the two sides of a portion in which the copper mesh of the two short sides was exposed was measured to obtain 0.4Ω.

TABLE 1

|  | Electrode Width of the Outermost Surface mm | Electrode Width of the Bottom mm | A/B | Resistance Value Between Long Sides Ω | Resistance Value Between Short Sides Ω |
| --- | --- | --- | --- | --- | --- |
| Example 1 | 0.55 | 0.37 | 1.5 | 0.9 | 0.4 |
| Example 2 | 0.60 | 0.30 | 2.0 | 0.5 | 0.4 |
| Example 3 | 0.55 | 0.37 | 1.5 | 0.9 | 1.4 |
| Comparative Example 1 | — | — | — | No conduction | 0.4 |
| Comparative Example 2 | 0.51 | 0.39 | 1.3 | No conduction | 0.4 |
| Example 4 | 0.55 | 0.37 | 1.5 | 0.4 | 0.2 |
| Example 5 | 0.60 | 0.30 | 2.0 | 0.5 | 0.4 |
| Example 6 | 0.60 | 0.30 | 2.0 | 0.5 | 0.4 |
| Comparative Example 3 | 0.51 | 0.39 | 1.3 | No conduction | 0.4 |

Example 7

First, a near infrared-ray shielding paint was applied to the PET film face of an anti-reflection film of a width of 1000 mm and a length of 1000 m using a flexible coater and dried in a hot air furnace to form a rear infrared-ray shielding layer. The thickness of the rear infrared-ray shielding layer was 12 μm. Next, a color sticking paint was applied onto the rear infrared-ray shielding layer using a flexible coater and dried in a hot air furnace, and then the anti-reflection film was slit into a width of 934 mm by means of a film slitter. The thickness of the sticking material was 25 μm. Next, the sticking material face of the above anti-reflection film was affixed to the copper mesh face of a copper mesh film of a width of 1000 mm and a length of 1000 m using a roll laminator. Subsequently, a UV curing sticking material was applied onto the PET film face of the above copper mesh film using a flexible coater and then cured by a UV irradiation apparatus. The thickness of the sticking material was 1 mm. Next, the affixed film was slit into a width of 964 mm using a film slitter to obtain a roll of laminate 1.

Next, the roll of laminate 1 was cut into a length of 554 mm to obtain laminate 1. FIG. 1 is a schematic plan view of laminate 1 of Example 7. The deviations of the end positions of the copper mesh film in the peripheral portion of laminate 1 of Example 7 and the anti-reflection film (a first insulator) were 0 mm on the two long sides and each 15 mm on the two short sides, and the ends of the two short sides were exposed on their copper mesh surfaces of the copper mesh film.

Figure 15:
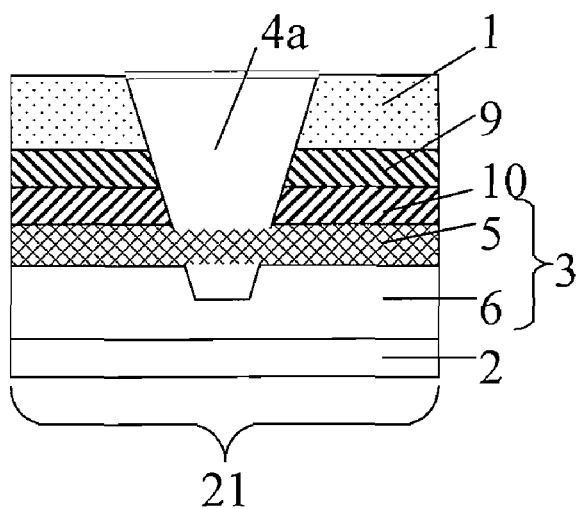
FIG. 15 is a schematic sectional view in a peripheral portion of an example of a laminate 2 constituting a flat-panel display member of the present invention.

Subsequently, laminate 1 was fixed to a laser cutter, and cavities were formed in a line shape of a length of 944 mm by irradiating 10 mm inside the ends of the two long sides of laminate 1 with a laser of an output of 30% and a head speed of 1300 cm/min from the outermost surface (outermost surface of the first face side) of the anti-reflection film of laminate 1 to obtain laminate 2. FIG. 2 is a schematic plan view of laminate 2 of Example 7; FIG. 15 is a schematic sectional view, in the thickness direction, of a portion in which a cavity is formed. The cavity reached the PET film (transparent resin layer) of the copper mesh film from the outermost surface (outermost surface of the first face side) of the anti-reflection film, and the copper mesh was exposed in all the directions.

Figure 16:
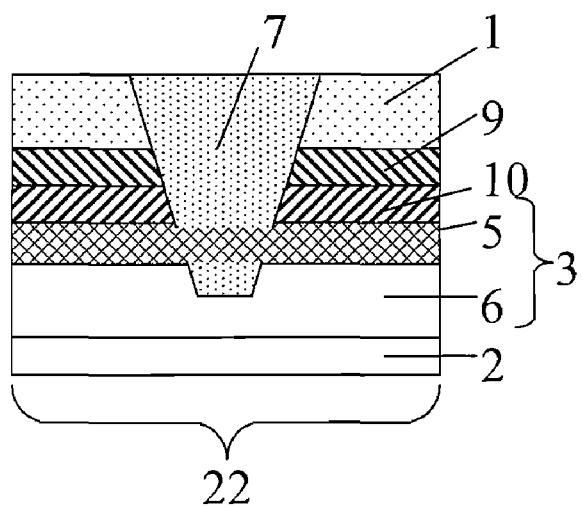
FIG. 16 is a schematic sectional view in a peripheral portion of an example of a flat-panel display member of the present invention.

Subsequently, electrically conductive paste was applied to the cavity portion of laminate 2 by means of a dispenser and then dried in an IR drying furnace and the electrode was filled to obtain a flat-panel display member of the present invention. FIG. 16 is a schematic sectional view, in the thickness direction, of a portion in which an electrode of the flat-panel display member of Example 7 is formed. The electrode reached the PET film of the copper mesh film from the outermost surface of the anti-reflection film. In addition, the average value of the width of the electrode at the height position of the outermost surface was 0.60 mm, the average value of the width of the electrode at the bottom was 0.30 mm, and the ratio (A/B) of the cross-sectional area A of the electrode at the outermost surface to the cross-sectional area B at the bottom was 2.0.

The resistance value between the electrodes at the electrode surfaces of the flat-panel display member thus obtained was measured to obtain 0.5Ω. In addition, the resistance value between the two sides of a portion in which the copper mesh of the two short sides was exposed was measured to obtain 0.4Ω. Furthermore, the transmittance was measured, with the smallest value in the range of from 580 to 610 mm being 20% and the largest value in the range of from 800 to 1100 mm being 13%.

Figure 17:
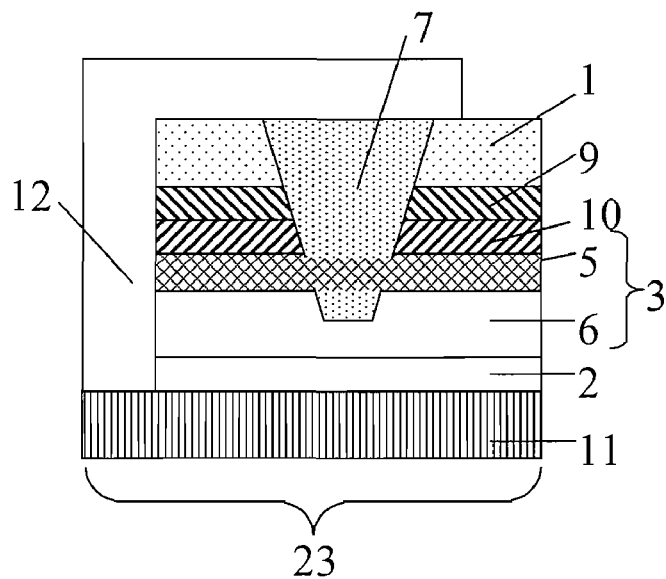
FIG. 17 is a schematic sectional view in a peripheral portion of an example of a flat-panel display of the present invention.

Next, the front filter of the plasma display television "42PX-20" was taken off and the flat-panel display member of the example was affixed to the visible side of the display, with the first face being on the visible side and the second face being on the display side, to thereby fabricate a cylinder. At the time, the electrodes of the two long sides of the flat-panel display member of the example and the copper mesh exposed portions of the two short-side copper mesh films were connected to the external electrode of the cylinder of the plasma display television "42PX-20" to obtain a flat-panel display of the present invention. FIG. 17 is a schematic sectional view in a portion in which the electrode of the flat-panel display of Example 7 is formed.

Electromagnetic wave shielding performance was measured on the flat-panel display thus obtained to obtain MAX35 dB at a frequency of from 30 to 88 MHz, which met class B of the FCC Standards. In addition, the color purity in the RGB indication was evaluated to obtain 90% of the RGB chromaticity of the NTSC, so the color purity was improved as compared with that of Comparative Example 4. Moreover, the near infrared-ray shielding performance was evaluated; as the result, malfunctions, etc. were not generated for the hard disk recorder "HG-02S" available from Sharp Corporation.

Comparative Example 4

A plasma display television, "42PX-20", was fabricated without disposing a flat-panel display member or a front filter to obtain a flat-plane display.

Electromagnetic wave shield performance was measured on the flat-panel display thus obtained to obtain MAX50 dB at a frequency of from 30 to 88 MHz, exceeding the tolerance of class B of the FCC Standards. In addition, the color purity in the RGB indication was evaluated to be 70% of the RGB chromaticity of the NTSC. Moreover, the near infrared ray shielding performance was evaluated, with "HG-02S", a hard disk recorder available from Sharp Corporation, generating malfunctions.

Example 8

A roll of laminate 1 was fabricated as in Example 7 with the exception that an anti-reflection film with a cover film having the cover film laminated on the surface (outermost surface of the first face) was used as the anti-reflection film. The roll of laminate 1 was cut as in Example 7 to thereby fabricate laminate 1 of a sheet shape.

Figure 18:
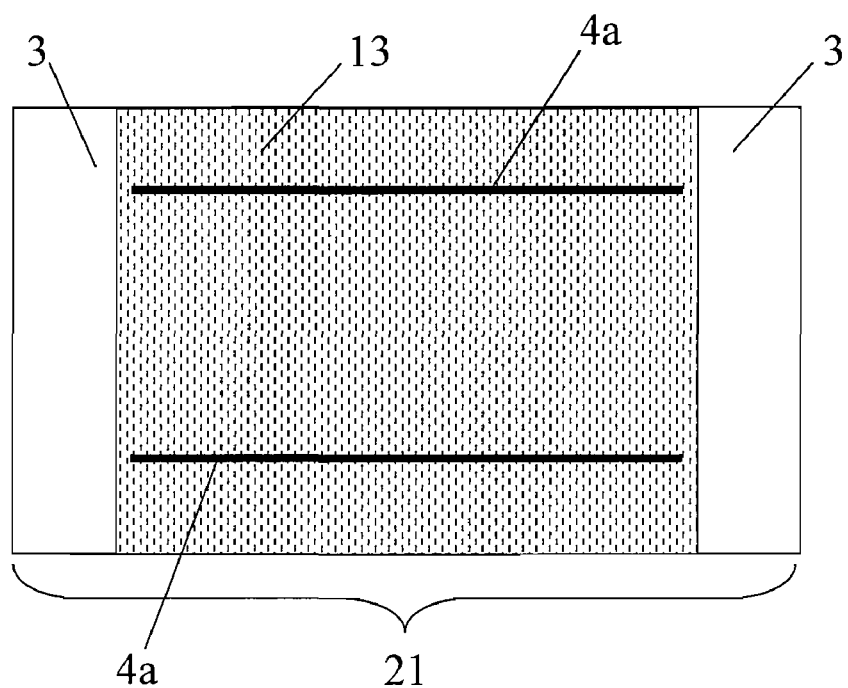
FIG. 18 is a schematic sectional view indicating an example of a laminate 2 constituting a flat-panel display member of the present invention.

Next, laminate 1 was fixed to a laser cutter, and cavities were formed in a line shape of a length of 920 mm by irradiating 10 mm inside the ends of the two long sides of laminate 1 with a laser of an output of 30% and a head speed of 1300 cm/min from the surface of the cover film of laminate 1 to obtain laminate 2. FIG. 18 is a schematic plan view of laminate 2 of Example 8; FIG. 19 is a schematic sectional view, in the thickness direction, of a portion in which a cavity is formed. The cavity reached the PET film (transparent resin layer) of the copper mesh film from the cover film surface, and the copper mesh was exposed in all the directions.

Subsequently, electrically conductive paste was applied to the cavity portion of laminate 2 by means of a dispenser and then dried in an IR drying furnace and the electrode was filled to obtain a flat-panel display member of the present invention. FIG. 20 is a schematic sectional view, in the thickness direction, of the peripheral portion of the flat-panel display member of Example 8. The electrode the flat-panel display member of Example 8 reached the PET film of the copper mesh film from the outermost surface of the cover film. In addition, the average value of the width of the electrode at the height position of the outermost surface (surface of the anti-reflection film) was 0.55 mm, the average value of the width of the electrode at the bottom was 0.30 mm, and the ratio (A/B) of the cross-sectional area A of the electrode at the outermost surface to the cross-sectional area B at the bottom was 1.8. Additionally, the height of a portion of the electrode protruded from the outermost surface (surface of the anti-reflection film) of the first face side was 40 μm.

The resistance value between the electrodes at the electrode surfaces of the flat-panel display member thus obtained was measured to obtain 0.5Ω. In addition, the resistance value between the two sides of a portion in which the copper mesh of the two short sides was exposed was measured to obtain 0.4Ω. Furthermore, the transmittance was measured, with the smallest value in the range of from 580 to 610 mm being 20% and the largest value in the range of from 800 to 1100 mm being 13%.

Figure 21:
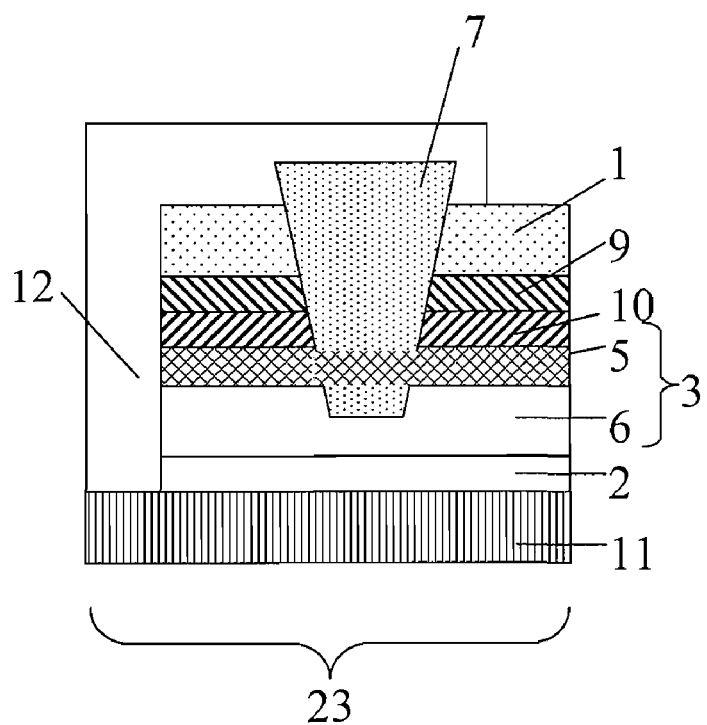
FIG. 21 is a schematic sectional view in a peripheral portion of an example of a flat-panel display of the present invention.

Next, the front filter of the plasma display television "42PX-20" was taken off and the flat-panel display member of the example was affixed to the visible side of the display, with the first face being on the visible side and the second face being on the display side, and then the cover film was detached and removed to thereby fabricate a cylinder. At the time, the electrodes of the two long sides of the flat-panel display member of the example and the copper mesh exposed portions of the two short-side copper mesh films were connected to the external electrode of the cylinder of the plasma display television "42PX-20" to obtain a flat-panel display of the present invention. FIG. 21 is a schematic sectional view in a portion in which the electrode of the flat-panel display of Example 8 is formed. The electrode is formed in a shape protruded from the outermost surface (surface of the anti-reflection film) of the first face of the flat-panel display member. The protruded portion of the electrode is eaten in the external electrode on the cylinder side, allowing the conduction between the electrode of the flat-panel display member and the external electrode to be stably and certainly obtained. The height of the protruded portion of the electrode corresponds to substantially the thickness of the cover film.

Electromagnetic wave shielding performance was measured on the flat-panel display thus obtained to obtain MAX35 dB at a frequency of from 30 to 88 MHz, which met class B of the FCC Standards. In addition, the color purity in the RGB indication was evaluated to obtain 90% of the RGB chromaticity of the NTSC, so the color purity was improved as compared with that of Comparative Example 4. Moreover, the near infrared-ray shielding performance was evaluated; as the result, malfunctions, etc. were not generated for the hard disk recorder "HG-02S" available from Sharp Corporation.

Example 9

The example was carried out as in Example 8 with the exception that lamination was performed in an atmosphere of a reduced pressure of 10 kPa when the copper mesh film was laminated with the anti-reflection film with a cover film. The performance of the flat-panel display member thus obtained was evaluated to obtain results as in Example 8. Additionally, for the purpose of the observation of the effects of lamination in a reduced pressure atmosphere, a sample was fabricated as in the above description with the exception that lamination was performed at ordinary atmosphere of pressure, and then the haze values were compared. The haze values of the flat-panel display member were 2.0% for the lamination in the reduced pressure atmosphere and 18% for the lamination in ordinary atmosphere. In addition, the haze value was 2.0% after subjecting the sample for the lamination in ordinary atmosphere to autoclave processing under the above conditions. The example shows that lamination under reduced pressure makes it possible to obtain transparency (haze value) equivalent to that of transparency processing by an autoclave. Hence, reduced pressure lamination leads to high productivity due to omission of autoclave processing.

10. The deviations of the end positions in the peripheral portion of the copper mesh film and the anti-reflection film of the laminate were each 0.2 mm on the two long sides and each 15 mm on the two short sides, and the ends of the two short sides were exposed on their copper mesh surfaces. Here, the heavy detachment processed PET film was detached and the light transmittance of the laminate was measured, with the smallest value in the wavelength range of from 580 to 610 mm being 70% and the largest value in the range of from 800 to 1100 mm being 85%.

Next, the heavy detachment processed PET film of the laminate was detached and the sticking material face was affixed to a display panel (device in which the front filter of the plasma display television "42PX-20" was removed) to obtain display panel 1.

Figure 22:
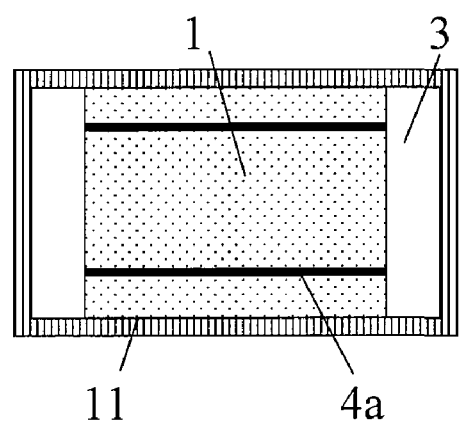
FIG. 22 is a planar view indicating an example of a display panel 2 constituting a flat-panel display of the present invention.
Figure 23:
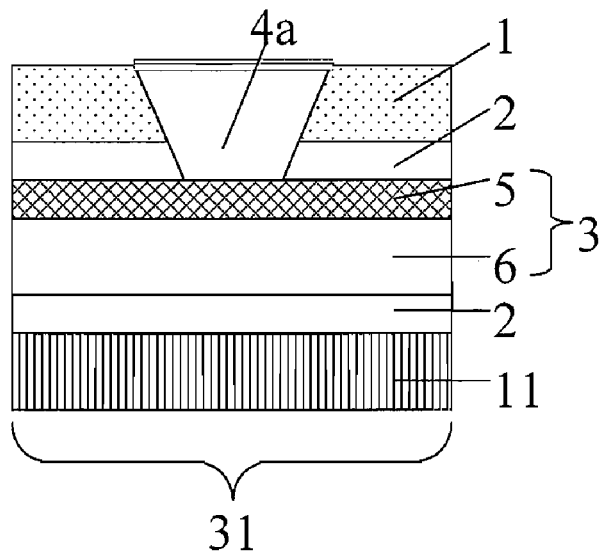
FIG. 23 is a schematic sectional view in a peripheral portion of an example of a display panel 2 constituting a flat-panel display of the present invention.

Subsequently, cavities of the laminate were formed in a line shape of a length of 930 mm by irradiating 10 mm inside the ends of the two long sides of the laminate with a laser of an output of 20% and a head speed of 1500 cm/min from the outermost surface (outermost surface of the first face side) of the anti-reflection film of the laminate affixed to the display panel to obtain display panel 2. FIG. 22 is a schematic plan view of display panel 2 of Example 10; FIG. 23 is a schematic sectional view in a portion in which a cavity is formed. The cavity reached the copper mesh surface from the outermost surface (outermost surface of the first face side) of the anti-reflection film and formed, and the copper mesh surface was exposed.

Next, electrically conductive paste was applied to the cavity portion of display panel 2 by means of a dispenser and then

TABLE 2

| | Electrode width of outermost surface mm | Electrode width of bottom mm | A/B | Protrusion of electrode from outermost surface μm | Resistance value between long sides Ω | Resistance value between short sides Ω | Smallest transmittance at from 580 to 610 nm | Largest transmittance at from 800 to 1100 nm | Electromagnetic wave shielding performance |
|---|---|---|---|---|---|---|---|---|---|
| Example 7 | 0.60 | 0.30 | 2.0 | 0 | 0.5 | 0.4 | 20% | 13% | 35 dB |
| Comparative Example 4 | — | — | — | — | — | — | — | — | 50 dB |
| Example 8 | 0.55 | 0.30 | 1.8 | 40 | 0.5 | 0.4 | 20% | 13% | 30 dB |
| Example 9 | 0.55 | 0.30 | 1.8 | 40 | 0.5 | 0.4 | 20% | 13% | 30 dB |

Example 10

Figure 24:
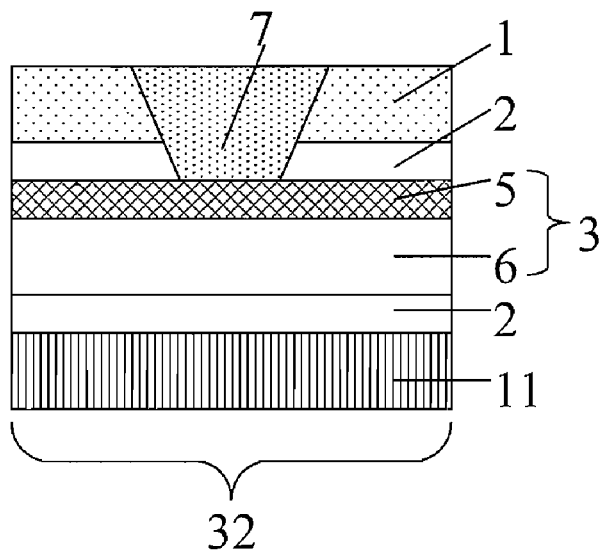
FIG. 24 is a schematic sectional view in a peripheral portion of an example of a display panel 3 constituting a flat-panel display of the present invention.

First, the PET film of the light detachment processed face side of a 554×934 mm film-like sticking material was detached, and then the sticking face was affixed to the PET film face of a 554×934 mm anti-reflection film using a sheet laminator, with the positions of the ends being put together, to thereby obtain an anti-reflection film with a sticking material. Next, the PET film of the light detachment processed face side of a 554×934 mm film-like sticking material was detached, and then the sticking face was affixed to the PET film face of a 554×934 mm copper mesh film using a sheet laminator, with the positions of the ends being put together, to thereby obtain a copper mesh film with a sticking material. Subsequently, the processed PET film of the heavy detachment processed face side of the film-like sticking material of the above anti-reflection film with the sticking material was detached, and then the sticking face was affixed to the copper mesh face of the above copper mesh film with a sticking material by means of a sheet laminator to obtain a laminate. In this laminate, the sticking material layer of the copper mesh film with the sticking material is protected by the heavy detachment processed PET film. FIG. 1 is a schematic plan view of the laminate of Example dried in an IR drying furnace to form an electrode and obtain a display panel 3. FIG. 24 is a schematic sectional view in a portion in which an electrode of display panel 3 of Example is formed. The electrode reached the copper mesh surface from the outermost surface of the anti-reflection film. In addition, the average value of the width of the electrode at the height position of the outermost surface was 0.65 mm, the average value of the width of the electrode at the bottom was 0.43 mm, and the ratio (A/B) of the cross-sectional area A of the electrode at the outermost surface to the cross-sectional area B at the bottom was 1.5.

Figure 25:
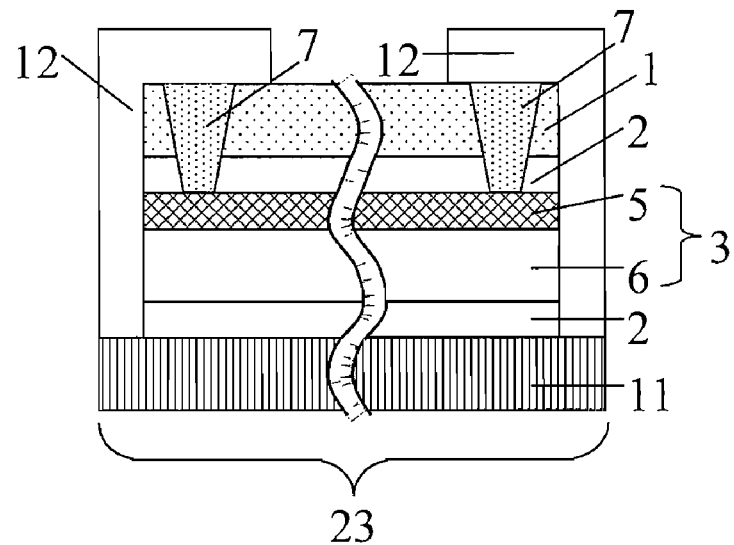
FIG. 25 is a schematic sectional view in a short side direction in the vicinity of the center of an example of a flat-panel display of the present invention.

Subsequently, the electrodes of the two long sides and the copper mesh exposed portions of the two short sides of the laminate of display panel 3 were connected to the external electrode of the cylinder to obtain a flat-panel display of the present invention. FIG. 25 is a schematic sectional view in the short side direction near the center of the flat-panel display of Example 10.

Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

Example 11

Figure 26:
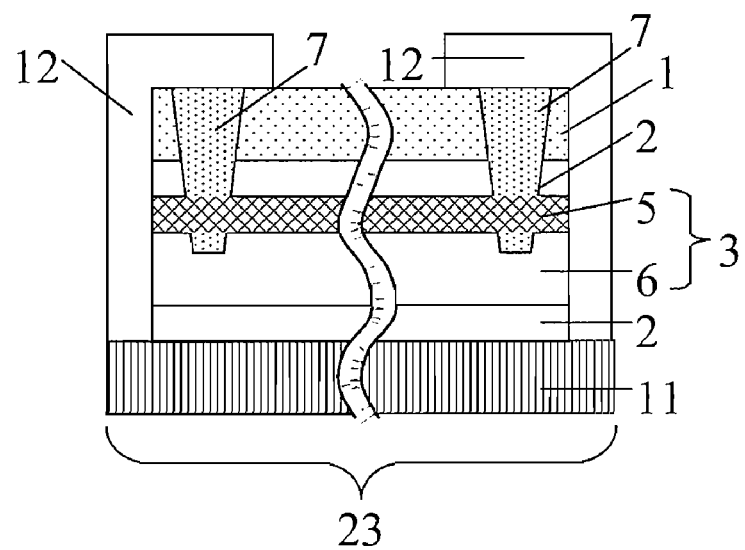
FIG. 26 is a schematic sectional view in a short side direction in the vicinity of the center of an example of a flat-panel display of the present invention.

A flat-panel display was obtained as in Example 10 with the exception that laser irradiation conditions were set to be an output of 30% and a head speed of 1300 cm/min. FIG. 26 is a schematic sectional view in the short side direction in the vicinity of the center of the flat-panel display of Example 11. The electrode of the flat-panel display of Example 11 reached the PET film (transparent resin layer) of the copper mesh film from the outermost surface of the anti-reflection film. In addition, the average value of the width of the electrode at the height position of the outermost surface was 0.70 mm, the average value of the width of the electrode at the bottom was 0.35 mm, and the ratio (A/B) of the cross-sectional area A of the electrode at the outermost surface to the cross-sectional area B at the bottom was 2.0.

Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

Example 12

First, a near infrared-ray shielding paint was applied to the PET film face of an anti-reflection film of a width of 1000 mm and a length of 1000 m using a flexible coater and dried in a hot air furnace to form a rear infrared-ray shielding layer. The thickness of the rear infrared-ray shielding layer was 12 μm. Next, a color sticking paint was applied onto the rear infrared-ray shielding layer using a flexible coater and dried in a hot air furnace, and then the anti-reflection film was slit into a width of 934 mm by means of a film slitter. The thickness of the sticking material was 25 μm. Next, the sticking face of the anti-reflection film was affixed to the copper mesh face of a copper mesh film of a width of 1000 mm and a length of 1000 m using a roll laminator in an atmosphere of a reduced pressure of 10 kPa. Subsequently, a UV curing sticking material was applied onto the PET film face of the copper mesh film using a flexible coater and then cured by a UV irradiation apparatus. Thereafter, a separate film (Cerapeel MT available from TORAY ADVANCED FILM Co., Ltd) was affixed to the sticking material surface. The thickness of the sticking material was 1 mm. Next, the affixed film was slit into a width of 964 mm using a film slitter to obtain a laminate roll. Moreover, the transmittance of the laminate, with the separate film being detached, was measured; as a result, the smallest value in the range of from 580 to 610 mm was 20% and the largest value in the range of from to 1100 mm was 13%.

Next, the separate film of the above laminate roll was detached, and then, while being cut into a length of 570 mm, the resulting roll was affixed to the display panel (device in which the front filter of the plasma display television "42PX-20" was removed) to obtain display panel 1.

Figure 27:
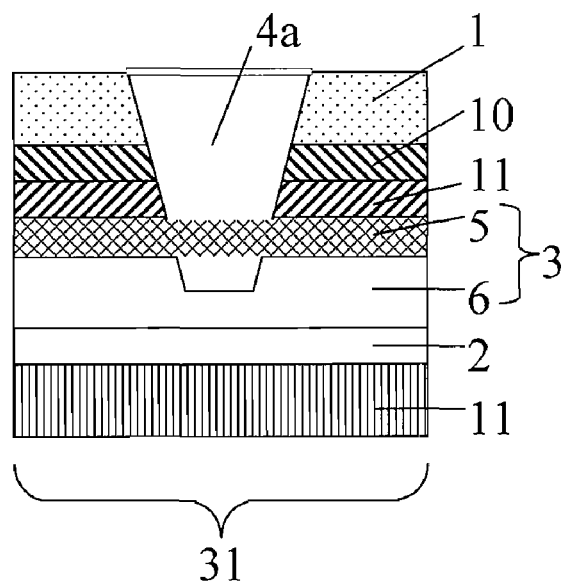
FIG. 27 is a schematic sectional view in a peripheral portion of an example of a display panel 2 constituting a flat-panel display of the present invention.

Subsequently, cavities were formed in a line shape of a length of 930 mm by irradiating 10 mm inside the ends of the two long sides of the laminate with a laser of an output of 30% and a head speed of 1300 cm/min from the outermost surface of the anti-reflection film of the laminate affixed to the display panel to obtain display panel 2. FIG. 27 is a schematic sectional view in a portion in which the cavity of display panel 2 of Example 12 is formed. The cavity reached the PET film of the copper mesh film from the outermost surface of the anti-reflection film, and the copper mesh surface was exposed.

Figure 28:
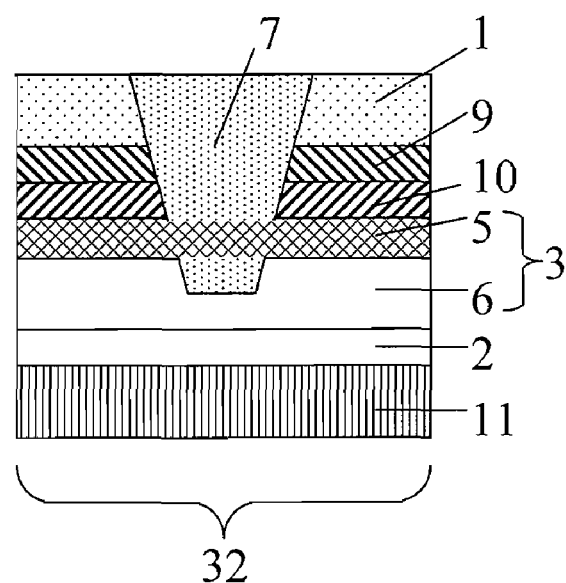
FIG. 28 is a schematic sectional view in a peripheral portion of an example of a display panel 3 constituting a flat-panel display of the present invention.

Next, electrically conductive paste was applied to the cavity portion of display panel 2 by means of a dispenser and then dried in an IR drying furnace and the electrode was formed to obtain display panel 3. FIG. 28 is a schematic sectional view in a portion in which an electrode of display panel 3 of Example 12 is formed. The electrode disposed in the two long sides of display panel 3 of Example 12 reached the PET film of the copper mesh film from the outermost surface of the anti-reflection film. In addition, the average value of the width of the electrode at the height position of the outermost surface was 0.60 mm, the average value of the width of the electrode at the bottom was 0.30 mm, and the ratio (A/B) of the cross-sectional area A of the electrode at the outermost surface to the cross-sectional area B at the bottom was 2.0.

Figure 29:
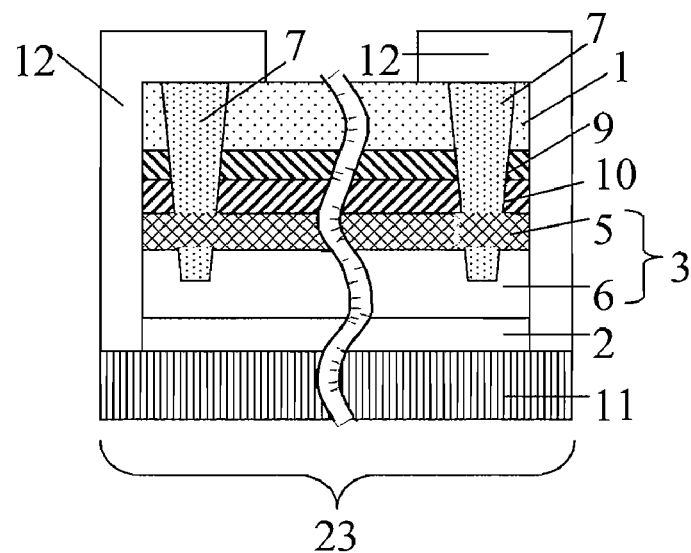
FIG. 29 is a schematic sectional view in a short side direction in the vicinity of the center of an example of a flat-panel display of the present invention.

Subsequently, the electrodes disposed in the two long sides of the laminate and the copper mesh exposed portions of the two short-side copper mesh layer, of display panel 3, were connected to the external electrode of the cylinder to obtain a flat-panel display of the present invention. FIG. 29 is a schematic sectional view of the flat-panel display of Example 12.

Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

Comparative Example 5

A flat-panel display was obtained as in Example 10 with the exception that cavity forming and electrode filling were not done. Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

Example 13

A laminate roll was fabricated as in Example 12 with the exception that an anti-reflection film with a cover film having laminated the cover film on the outermost surface (corresponds to the outermost surface of the first face) was used as the anti-reflection film.

Next, the separate film of the laminate roll was detached, and then, while being cut into a length of 554 mm, the resulting roll was affixed to the display panel (device in which the front filter of the plasma display television "42PX-20" was removed) to obtain display panel 1.

Figure 30:
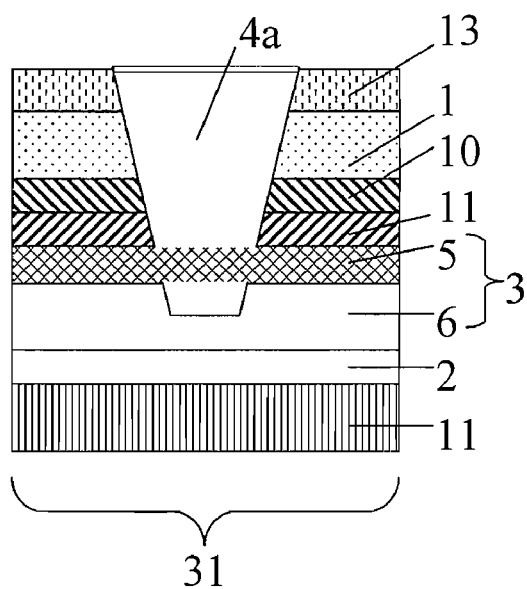
FIG. 30 is a schematic sectional view in a peripheral portion of an example of a display panel 2 constituting a flat-panel display of the present invention.

Next, cavities were formed in a line shape of a length of 920 mm by irradiating 10 mm inside the ends of the two long sides of the laminate with a laser of an output of 30% and a head speed of 1300 cm/min from the surface of the cover film of the laminate affixed to the display panel to obtain display panel 2. FIG. 30 is a schematic sectional view in a portion in which the cavity of display panel 2 of Example 13 is formed. The cavity of display panel 2 of Example 13 reached the PET film of the copper mesh film from the cover film, and the copper mesh surface was exposed.

Next, electrically conductive paste was applied to the cavity portion of display panel 2 by means of a dispenser and then dried in an IR drying furnace. Thereafter, the electrode was formed and then the cover film was detached and removed to obtain display panel 3. FIG. 31 is a schematic sectional view in a portion in which an electrode of display panel 3 of Example is formed. The electrode disposed in the two long sides of display panel 3 of Example 13 was formed in a shape protruded from the outermost surface (anti-reflection layer) of the first face. Additionally, the bottom of the electrode reached the PET film of the copper mesh film. In addition, the average value of the width of the electrode at the height position of the outermost surface of the first face side (surface of the anti-reflection film) was 0.59 mm, the average value of the width of the electrode at the bottom was 0.33 mm, and the ratio (A/B) of the cross-sectional area A of the electrode at the outermost surface to the cross-sectional area B at the bottom was 1.8. Moreover, the height of the electrode of the portion protruded from the outermost surface (surface of the anti-reflection layer) of the first face side was 40 μm.

Figure 32:
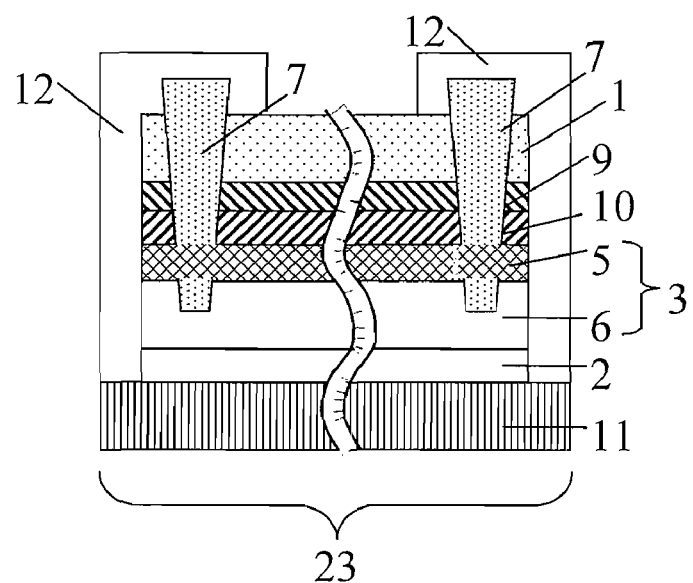
FIG. 32 is a schematic sectional view in a short side direction in the vicinity of the center of an example of a flat-panel display of the present invention.

Subsequently, the electrodes disposed in the two long sides of the laminate and the copper mesh exposed portions of the two short-side copper mesh layer, of display panel 3, were connected to the external electrode of the cylinder to obtain a flat-panel display of the present invention. FIG. 32 is a schematic sectional view of the flat-panel display of Example 13.

Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

Example 14

A laminate roll with a cover film was fabricated as in Example 13, and then this laminate roll was cut into a length of 554 to obtain a sheet-like laminate. Cavities were formed in a line shape of a length of 920 mm by irradiating 10 mm inside the ends of the two long sides of laminate 1 with a laser of an output of 30% and a head speed of 1300 cm/min from the cover film surface of the sheet-like laminate. The cavity reached the PET film of the copper mesh film form the cover film and the copper mesh surface was exposed. Next, the sheet-like laminate in which the cavity was formed was affixed to a display panel (device in which the front filter of the plasma display television "42PX-20" was removed). Electrically conductive paste was applied to the cavity portion by means of a dispenser and then dried in an IR drying furnace to form an electrode. Subsequently, the cover film was detached and removed to obtain display panel 3. FIG. 31 is a schematic sectional view in a portion in which the electrode of display panel 3 is formed. The shape of the electrode disposed in the two long sides of display panel 3 was substantially the same as in Example 13.

Subsequently, the electrodes disposed in the two long sides of the laminate and the copper mesh exposed portions of the two short-side copper mesh layer, of display panel 3, were connected to the external electrode of the cylinder to obtain a flat-panel display of the present invention. FIG. 32 is a schematic sectional view of the flat-panel display.

Electromagnetic wave shielding performance of the flat-panel display thus obtained gave MAX35 dB at a frequency of from 30 to 88 MHz, which met class B of the FCC Standards. In addition, with the visibility, there were no double images or external light ghosts present.

INDUSTRIAL APPLICATION

According to the present invention, a flat-panel display member excellent in productivity can be provided, and further disposing the flat-panel display member on a visible side enables a flat-panel display excellent in electromagnetic wave shielding properties to be provided.

The invention claimed is:

1. A method of manufacturing a flat-panel display member comprising at least an anti-reflection layer, an electrically conductive layer comprising a mesh, and a transparent resin layer, the method comprising, in this order:
   obtaining a laminate comprising the anti-reflection layer on a first face of the electrically conductive layer and the transparent resin layer on a second face on an other side of the first face of the electrically conductive layer, and
   forming a cavity by a laser, the cavity being formed in a periphery of the laminate from at least a surface of the anti-reflection layer and reaching the transparent resin layer but not penetrating through the laminate, wherein the forming the cavity by the laser is done without cutting the electrically conductive layer.

2. The method of manufacturing a flat-panel display member of claim 1, wherein the laminate comprises a cover film on a surface of the anti-reflection layer, and the cavity is formed from at least a surface of the cover film.

3. The method of manufacturing a flat-panel display member of claim 1, wherein the anti-reflection layer is a film selected from the group consisting of an anti-reflection film, an anti-glare film and an anti-glare anti-reflection film.

4. The method of manufacturing a flat-panel display member of claim 1, wherein the laser is $CO_2$ laser.

5. The method of manufacturing a flat-panel display member of claim 1, further comprising:
   affixing the laminate on a glass substrate subsequent to the obtaining the laminate and followed by the forming the cavity.

6. The method of manufacturing a flat-panel display member of claim 1, further comprising:
   filling a conductive material in the cavity subsequent to the forming the cavity.

7. The method of manufacturing a flat-panel display member of claim 1, further comprising manufacturing the laminate.

8. A method of manufacturing a flat-panel display, comprising:
   disposing a laminate on a visible side of a flat-panel display body, the laminate having at least an anti-reflection layer, an electrically conductive layer comprising conductive meshes and a transparent resin layer, the anti-reflection layer being disposed on a first face of the electrically conductive layer, and the transparent resin

TABLE 3

|  | Electrode width of outermost surface mm | Electrode width of bottom mm | A/B | Protrusion of electrode from outermost surface μm | Smallest transmittance at from 580 to 610 nm | Largest transmittance at from 800 to 1100 nm | Electromagnetic wave shielding performance | Double image | Ghosts |
|---|---|---|---|---|---|---|---|---|---|
| Example 10 | 0.65 | 0.43 | 1.5 | 0 | 70% | 85% | 35 dB | None | None |
| Example 11 | 0.70 | 0.35 | 2.0 | 0 | 70% | 85% | 30 dB | None | None |
| Example 12 | 0.60 | 0.30 | 2.0 | 0 | 20% | 13% | 30 dB | None | None |
| Comparative Example 5 | — | — | — | — | 70% | 85% | 48 dB | None | None |
| Example 13 | 0.59 | 0.33 | 1.8 | 40 | 20% | 13% | 30 dB | None | None |
| Example 14 | 0.59 | 0.33 | 1.8 | 40 | 20% | 13% | 30 dB | None | None | layer disposed on a second face on an other side of the first face of the electrically conductive layer, and forming a cavity by a laser, the cavity being formed in periphery of the laminate from at least a surface of the anti-reflection layer and reaching the transparent resin layer but not penetrating through the laminate, wherein the forming the cavity by the laser is done without cutting the electrically conductive layer.

9. The method of manufacturing a flat-panel display of claim 8, wherein the laminate comprises a cover film on a surface of the anti-reflection layer and the cavity is formed from a surface of the cover film.

10. The method of manufacturing a flat-panel display of claim 8, wherein the anti-reflection layer is one of the selected form an anti-reflection film, an anti-glare film and an anti-glare anti-reflection film.

11. The method of manufacturing a flat-panel display of claim 8, wherein the laser is $CO_2$ laser.

* * * * *